(12) United States Patent
Tsukada et al.

(10) Patent No.: US 6,455,783 B1
(45) Date of Patent: Sep. 24, 2002

(54) MULTILAYER PRINTED WIRING BOARD AND METHOD FOR MANUFACTURING THE SAME

(75) Inventors: Kiyotaka Tsukada, Nagoya; Mitsuhiro Kondo; Naoto Ishida, both of Ogaki; Kouji Asano, Gifu-ken; Hisashi Minoura, Ogaki, all of (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 09/554,481
(22) PCT Filed: Nov. 19, 1998
(86) PCT No.: PCT/JP98/05200
§ 371 (c)(1),
(2), (4) Date: May 11, 2000
(87) PCT Pub. No.: WO99/26448
PCT Pub. Date: May 27, 1999

(30) Foreign Application Priority Data

Nov. 19, 1997 (JP) ............................... 9-336378
Nov. 20, 1997 (JP) ............................... 9-337870
Nov. 21, 1997 (JP) ............................... 9-338086

(51) Int. Cl.[7] ................................. H05K 1/03
(52) U.S. Cl. ........................ 174/256; 174/262; 257/700; 361/760

(58) Field of Search ................................. 174/255, 256, 174/261, 262, 260; 428/901; 361/760, 761; 257/700, 709

(56) References Cited

U.S. PATENT DOCUMENTS

| | | | | |
|---|---|---|---|---|
| 4,775,573 A | * | 10/1988 | Turek | 428/901 |
| 5,339,217 A | * | 8/1994 | Cohen et al. | 428/901 |
| 5,414,224 A | * | 5/1995 | Adasko et al. | 174/255 |
| 6,239,980 B1 | * | 5/2001 | Fillion et al. | 174/255 |

* cited by examiner

*Primary Examiner*—Albert W. Paladini
(74) *Attorney, Agent, or Firm*—Robert D. Buyan; Stout, Uxa, Buyan & Mullins, LLP

(57) ABSTRACT

A method for manufacturing a multilayer printed circuit board that shortens the distance between pattern layers and facilitates formation of a minute conductive hole having superior conductive reliability. A core substrate (21) including ad core pattern (12, 13), which has a pad (101, 111), is first prepared. Then, a laminated plate is formed by laminating an insulating layer (22) on the surface of the core substrate. Afterward, a surface pattern (11) is formed on the surface of the laminated plate. Further, the conductive hole (30, 31) is formed by irradiating a laser beam at the laminated plate. The bottom opening of the conductive hole (30, 31) is covered by the pad (101, 111).

15 Claims, 25 Drawing Sheets

MULTILAYER PRINTED WIRING BOARD AND METHOD FOR MANUFACTURING THE SAME

BACKGROUND OF THE INVENTION

The present invention relates to a multilayer printed circuit board and a method of manufacturing the same, and more particularly, to the manufacture of a thin insulating layer, the formation of conductive holes, and the protection of the circuit board from etching liquids.

BACKGROUND ART

In multilayer printed circuit boards, there has been a recent demand to thin insulating layers in order to shorten the distance between pattern layers, which transmit signals at high speeds.

FIG. 1 shows a conventional method for manufacturing a multilayer, printed circuit board. In the method, conductive holes 92 and conductive patterns 93 are formed on insulating substrates 91, and a plural number of the substrates 91 are laminated together.

In the above method, however, the conductive holes 92 and the conductive patterns 93 must be formed beforehand on the insulating substrates 91. This makes it difficult to thin the insulating substrates 91.

FIG. 2 shows a conventional build-up process through which thin insulating layers are formed. In the build-up process, an insulating substrate 91 having a conductive hole 92 and a conductive pattern 93 is prepared. An insulating layer 911, made of prepreg or the like, is laminated on the surface of the substrate 91. A conductive pattern 931 is then formed on the surface of the insulating layer 911. Afterward, the insulating layer 911 is irradiated with ultraviolet rays and developed to form a conductive hole 921 in the insulating layer 911. A plating film 930 is then applied to the wall of the conductive hole 921. Since thin insulating layers are laminated in this method, the distance between the conductive patterns 93, 931 is decreased and high speed transmission of signals is enabled.

In the above build-up process, however, residual resin left on the insulating layer 911 after formation of the conductive hole can result in unsatisfactory conduction of the conductive hole 921. Thus, the conductive hole 921 must be large. However, this makes it difficult to narrow the pitch between conductive holes.

Further, as shown in FIG. 3, in a multilayer printed circuit board having a mounting hole 94, an exposed portion of the conductive pattern 93 in the mounting hole 94 may be corroded by copper foil etching liquid when forming the conductive hole 921. This may result in unsatisfactory connection between the exposed portion of a bonding pad 942 in the mounting hole 94 and a bonding wire.

It is a first object of the present invention to provide a multilayer printed circuit board and a method for manufacturing the same that shortens the distance between patterns and facilitates the formation of minute conductive holes having superior conductive reliability.

It is a second object of the present invention to provide a multilayer electronic component mounting substrate and a method for manufacturing the same that has connection terminals having a superior corrosion resisting characteristic with respect to etching liquids and a superior connecting reliability with respect to bonding wires.

SUMMARY OF THE INVENTION

In a first aspect of the present invention, a method for manufacturing a multilayer printed circuit board is provided. First, a core substrate including a core pattern, which has a pad for covering a bottom opening of a conductive hole, is prepared. Then, a laminated plate is formed by laminating an insulating layer on the surface of the core substrate. Then, a surface pattern is formed on the surface of the laminated plate at portions other than where the conductive hole is formed. Then, the conductive hole, the bottom opening of which is covered by the pad, is formed by irradiating a laser beam at a conductive hole formation portion of the laminated plate. Then, the entire surface of the insulating layer, which includes the interior of the conductive hole, is coated with a thin plating film. Subsequently, a mask is applied to the thin plating film with the conductive hole in an opened state and the wall of the conductive hole is coated with a conductive coating. Afterward, the mask is removed. Further, the thin plating film excluding the portions coated by the conductive coating is removed.

The most significant features of the present invention are that a build-up process, which laminates insulating layers on the surface of the core substrate, is performed, and a conductive hole that reaches a pad is milled on a laminated plate by irradiating a laser beam.

In the present invention, a core pattern refers to one layer or two or more layers of conductive patters that are formed on the surface or interior of the core substrate. The surface pattern refers to a conductive pattern formed on the surface of the insulating layer. Further, pattern will refer to the core pattern and/or the surface pattern below.

In this method, the insulating layer is reinforced by the core substrate when forming the conductive hole and the surface pattern. This enables a thinner insulating layer to be formed.

It is preferred that a land surround a middle portion of the conductive hole formation portion. The land and the conductive coating that coats the wall of the conductive hole are both metal and thus have substantially the same coefficient of thermal expansion. This inhibits the conductive coating from falling off the wall of the conductive hole when a thermal impact is applied.

Further, even if the conductive hole is relatively deep, the thin plating film is applied to the wall of the conductive hole in a uniform manner and conduction reliability is improved by providing the land at the middle portion of the conductive hole.

When the land is used only to reinforce the conductive hole, the land and core pattern that are located on the same layer are insulated from each other. However, the land and core pattern located on the same layer may be electrically connected to each other.

It is preferred that the thin plating film have a thickness of 0.01 $\mu$m to 5 $\mu$m.

It is preferred that the insulative core substrate have a mechanical strength that enables the formation of a pattern and a hole. The core substrate includes a resin substrate filled with glass fiber or glass cloth. The core substrate includes a core pattern formed on at least one of the surface and interior of the core substrate.

It is preferred that the insulating layer have a thickness of 30 $\mu$m to 150 $\mu$m.

The insulating layer may be formed on either one side or both sides of the core substrate.

Further, the insulating layer may be formed by, for example, printing and applying prepreg, which is formed by semihardening resin impregnated in glass fiber or glass cloth, or applying a sheet of prepreg and then hardening the resin in the prepreg.

It is preferred that the conductive hole have a diameter of 30 µm to 300 µm.

It is preferred that the thin plating film be formed by, for example, a chemical plating film, which is made of conductive material such as copper, tin plating, the application of a solder palladium catalyst, or a lamination of these materials.

A second aspect of the present invention provides a multilayer printed circuit board comprising a core substrate including a core pattern, an insulating layer coating the surface of the core substrate, a surface pattern provided on the surface of the insulating layer, and a conductive hole for electrically connecting the surface pattern to the core pattern. The core pattern includes a pad covering a bottom opening of the conductive hole.

A third aspect of the present invention provides a method for manufacturing a multilayer electronic component mounting substrate. Initially, in a first step, a core substrate including an electronic component mounting hole, a connection terminal exposed together with the mounting hole, and a core pattern, which has a pad for covering a bottom opening of a conductive hole, are prepared. Then, in a second step, a laminated plate is formed by laminating an insulating layer on the surface of the core substrate with the mounting hole and the connection terminal in an exposed state. In a third step, the surface of the connection terminal is coated with an electroless plating film. Then, in a fourth step, a metal layer is formed on the surface of the laminated plate. In a fifth step, the conductive hole, the bottom opening of which is covered by the pad, is formed by irradiating a laser beam at a conductive hole formation portion of the laminated plate. In a sixth step, a conductive coating in the interior of the conductive hole is formed. In a seventh step, the metal layer is etched and the surface pattern is formed. The laminated plate is heated after the third step and before the seventh step.

In the third aspect of the present invention, the connection terminal, which is exposed together with the mounting hole, is coated by the electroless plating film. It is preferred that the connection terminal be made of copper.

However, the copper included in the connection terminal may infiltrate the electroless plating film. Copper is a material that degrades the corrosion characteristic with respect to etching liquids. The electroless plating film is heated to diffuse the copper in the electroless plating film to the film surface. As a result, self-sintering of the electroless plating film is enhanced and a fine film structure is obtained. This improves the corrosion resistance of the electroless plating relative to the etching liquid used to form the surface pattern (seventh process). Accordingly, the connection terminal exposed to the interior of the mounting hole is not corroded by the etching liquid. This improves the bonding strength of bonding wires, flip chips, and soldering connection relative to the connection terminal.

A fourth aspect of the present invention provides a method for manufacturing a multilayer electronic component mounting substrate. Initially, in a first step, a core substrate including an electronic component mounting hole, a connection terminal exposed together with the mounting hole, and a core pattern, which has a pad for covering a bottom opening of a conductive hole, is formed. Then, in a second step, a laminated plate is formed by laminating an insulating layer on the surface of the core substrate with the mounting hole and the connection terminal in an exposed state. In a third step, the surface of the connection terminal is coated with an electroless plating film. Then, in a fourth step, a metal layer is formed on the surface of the laminated plate. In a fifth step, the metal layer is etched to form the surface pattern. Then, in a sixth step, the conductive hole, the bottom opening of which is covered by the pad, is formed by irradiating a laser beam at a conductive hole formation portion of the laminated plate. Then, in a seventh step, a conductive coating in the interior of the conductive hole is formed. The laminated plate is heated after the third step and before the fifth step.

In the third aspect, the conductive hole is formed after the formation of the surface pattern, and in the fourth aspect, the surface pattern is formed after the formation of the conductive hole.

In the fourth aspect, any one of the second and third steps may be performed first. It is only required that the superimposed plate be heated after forming the electroless plating film and before forming the surface pattern.

It is preferred that the electroless plating film be formed by tan electroless Ni—Au plating or an electroless Ni—Pd plating.

A fifth aspect of the present invention provides a multilayer electronic component mounting substrate comprising a mounting hole for mounting electronic components, a core substrate including a core pattern, an insulating layer arranged on the surface of the core substrate, a surface pattern arranged on the surface of the insulating layer, a conductive hole for electrically connecting the core pattern to the surface pattern, and a connection terminal exposed together with the mounting hole. The connection terminal is coated by an electroless plating film formed by an electroless Ni—Au plating or an electroless Ni—Pd plating. Further, the core pattern includes a pad covering a bottom opening of the conductive hole.

A sixth aspect of the present invention provides a method for manufacturing a multilayer electronic component mounting substrate. Initially, a core substrate including a core pattern and a mounting hole is prepared. Then, a laminated plate is formed by laminating an insulating layer, which corresponds with the mounting hole, on the surface of the core substrate. The surface of the laminated plate is coated with metal foil to cover the mounting hole. A conductive hole is formed in the laminated plate and the wall of the conductive hole is coated with a conductive coating. The metal foil is patterned to form the surface pattern, and a cover for covering the mounting hole and part of the insulating layer surrounding the mounting hole is formed. Further, the cover is removed by milling part of the insulating layer, which surrounds the mounting hole, to expose the mounting hole.

The most significant features of the present invention are that a build-up process, which laminates insulating layers on the surface of the core substrate, is performed, and the formation of the conductive hole, the coating of the conductive hole with the conductive coating, and the formation of the surface pattern are performed with the mounting hole in a state coated by the metal foil.

A seventh aspect of the present invention provides a multilayer electronic component mounting substrate comprising a core substrate including a core pattern, an insulating layer arranged on the surface of the core substrate, a surface pattern provided on the surface of the insulating layer, a conductive hole electrically connecting the surface pattern and the core pattern, and a mounting hole provided in the core substrate. The insulating layer includes an opening corresponding with the mounting hole and a recess formed surrounding the opening.

DETAILED DESCRIPTION OF THE INVENTION

First Embodiment

A method for manufacturing a multilayer printed circuit board according to a first embodiment of the present invention will now be described with reference to FIGS. 4 to 18.

Figure 1:
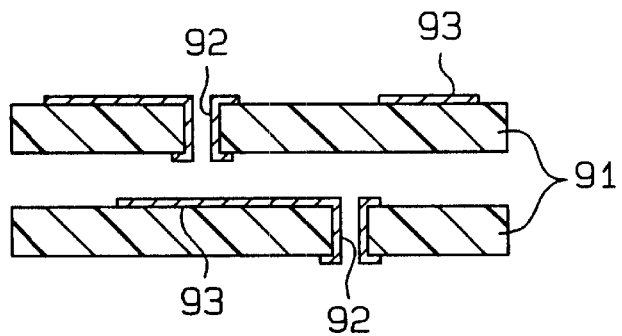
FIG. 1 is a diagrammatic view illustrating a first prior art method for manufacturing a multilayer printed board circuit.
Figure 2:
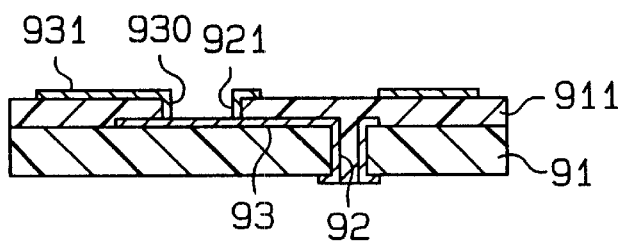
FIG. 2 is a diagrammatic view illustrating a second prior art method for manufacturing a multilayer printed board circuit.
Figure 3:
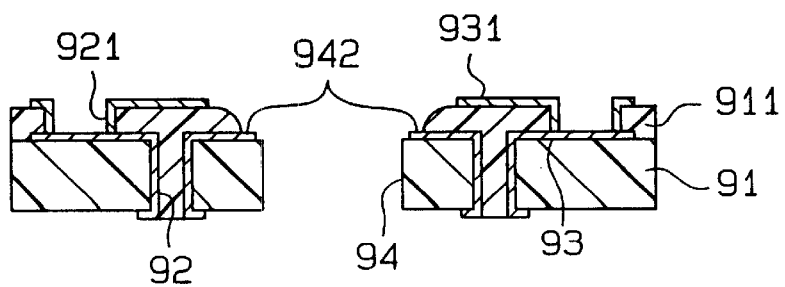
FIG. 3 is a diagrammatic view illustrating the second prior art method for manufacturing a multilayer printed board circuit.
Figure 4:
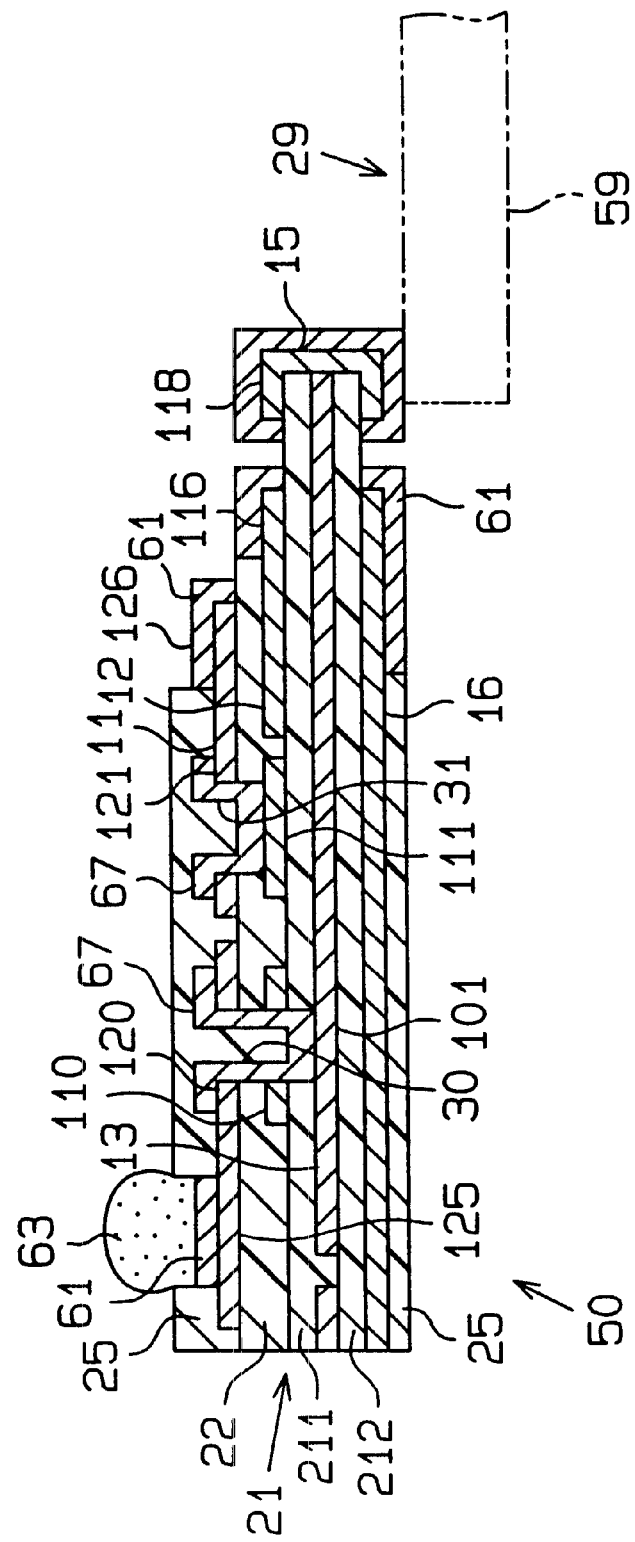
FIG. 4 is a schematic cross-sectional view showing a multilayer printed circuit board according to a first embodiment of the present invention.

As shown in FIG. 4, a multilayer printed circuit board 50 includes a core substrate 21 having core patterns 12, 13, 16, an insulating layer 22 laminated on the surface of the core substrate 21, a surface pattern 11 formed on the insulating layer 22, land conductive holes 30, 31.

The conductive hole 30 electrically connects the core pattern 13 and the surface pattern 11. The conductive hole 31 electrically connects the core pattern 12 and the surface pattern 11. The middle of the conductive hole 30 is surrounded by a ring-like reinforcing land 110.

The core patterns 13, 12 have coating pads 101, 111, which respectively cover the opened bottom of the conductive holes 30, 31. The surface pattern 11 has lands 120, 121, which surround the openings of the conductive holes 30, 31, respectively.

The surface pattern 11 has a pad 125 that is connected to an external connection with a solder ball 63.

Figure 9:
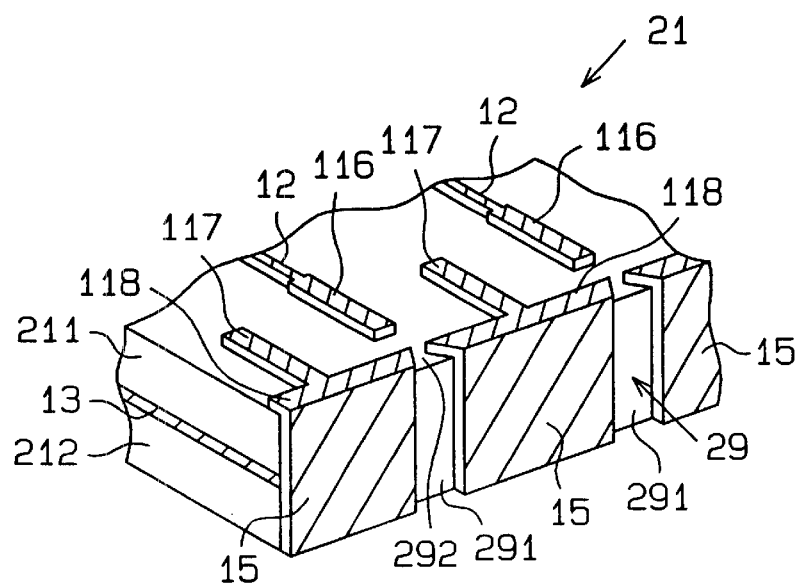
FIG. 9 is a partial perspective view showing the core substrate with the core pattern.

A mounting hole 29 used to mount electronic components is associated with the multilayer printed circuit board 50. A plurality of strip-like wall surface patterns 15 are arranged on the wall of the mounting hole 29, as shown in FIG. 9. The wall-surface patterns 15 are electrically connected to the core pattern 13. The mounting hole 29 is surrounded by bonding pads 116, 126, 117 that are electrically connected to the core pattern 12, the surface pattern 11, and the wall surface patterns 15.

As shown in FIG. 4, the opening at one end of the mounting hole 29 is covered by a heat radiating plate 59. The surface of the multilayer printed circuit board 50 is coated with a solder resist 25.

The method for manufacturing the multilayer printed circuit board will now be described.

(1) Manufacture of the Core Substrate

Figure 5:
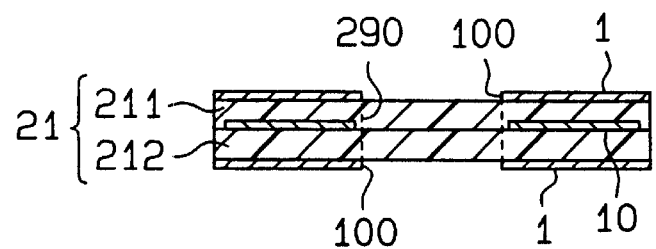
FIG. 5 is a cross-sectional view showing a core substrate of the multilayer printed circuit board of FIG. 4.

As shown in FIG. 5, an insulating substrate including insulating layers 211, 212 is first prepared. The insulating layers 211, 212 are formed preferably from an epoxy, polyimide, or bismalimidetriazine resin which is preferably filled with a reinforced material made of glass fiber or glass cloth. Copper foils 1 are applied to the surface of the insulating layers 211, 212. Processes, such as development and etching, are then performed to pattern the copper foils 1 on one surface of the insulating layer 212 and form the core pattern 13. An opening 100 is then formed in the insulating layers 211, 212 at a predetermined mounting hole formation portion 290 in the remaining portion of the copper foil 1.

The insulating layers 212, 211 are then secured preferably using an adhesive (not shown) such as prepreg to form the core substrate 21. The mounting hole formation portion 290 is then formed using a means such as a router to form the mounting hole 29.

Figure 6:
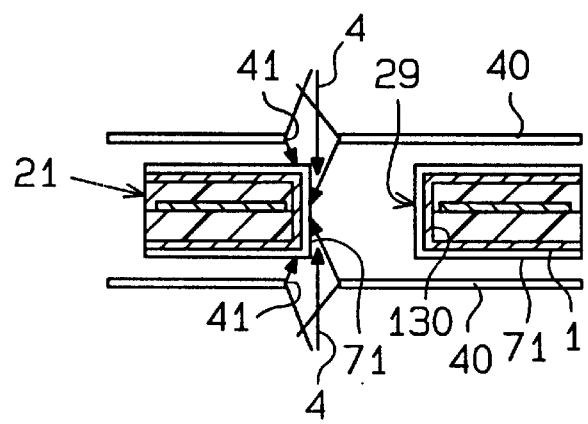
FIG. 6 is a cross-sectional view showing the core substrate and illustrating a method for forming a wall surface pattern.

Then, with reference to FIG. 6, a metal plating 130 is applied to the surface of the core substrate 21, including the wall of the mounting hole 29, by chemical plating and electroplating. Afterward, a resist film 71 made of a negative photosensitive resin is applied to the surface of the core substrate 21.

Wall surface pattern formation masks 40 are then applied to the upper and lower surfaces of the core substrate 21. The masks 40 each have slits 41 for exposing part of the resist film 71 (wall surface pattern non-formation portion), which coats the mounting hole 29.

The core substrate 21 is then irradiated with a scattered light 4. This sensitizes the resist film 71 at the wall surface pattern non-formation portion and the ends of the mounting hole 29.

Figure 7:
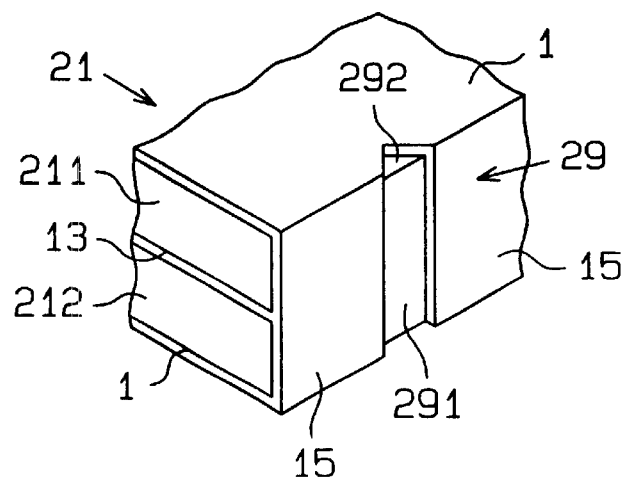
FIG. 7 is a partial perspective view showing the core substrate having the wall surface pattern.

The masks 40 are then removed, and the resist film 71 is developed to eliminate the portions of the resist film 71 corresponding to the wall surface pattern non-formation portion and the wall surface pad non-formation portion. The metal plating 130 and the copper foils 1 exposed from the resist film 71 are etched and removed. Consequently, as shown in FIG. 7, exposed surfaces 291 of the core substrate 21 are formed on the wall of the mounting hole 29, and the wall surface patterns 15 are formed between the exposed surfaces 291. Further, exposed surfaces 292 are formed at the ends of the mounting hole 29.

The residual resist film 71 on the surface of the core substrate 21 is removed with an alkali solvent. This exposes the wall surface pattern 15 and the copper foil 1, as shown in FIG. 7.

Figure 8:
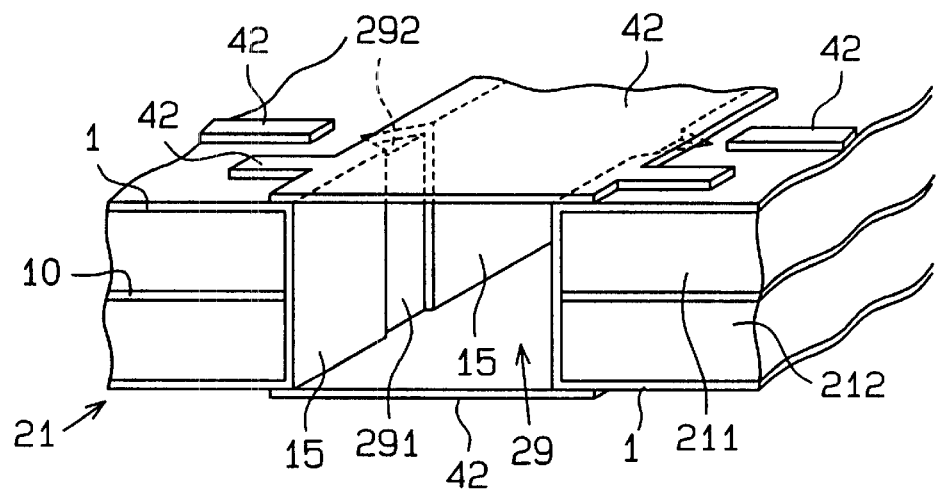
FIG. 8 is a partial perspective view showing the core substrate with a mask applied thereon to form a core pattern.
Figure 10:
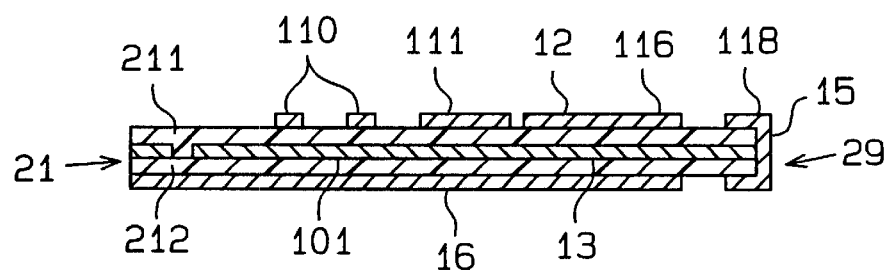
FIG. 10 is a cross-sectional view showing the core substrate with the core pattern.
Figure 11:
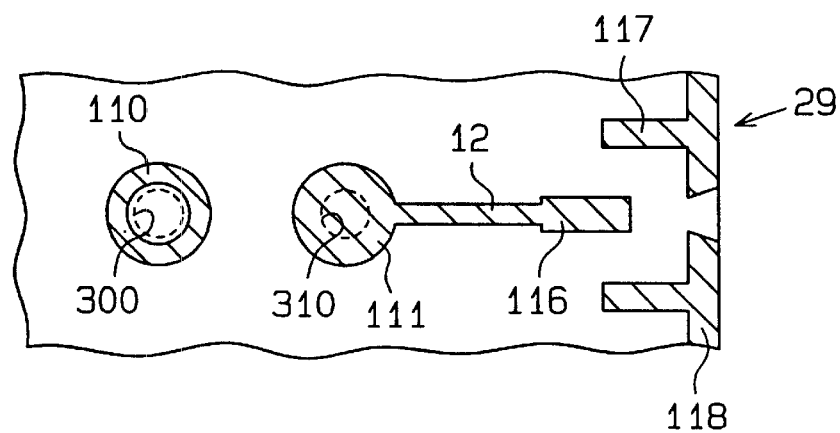
FIG. 11 is a plan view showing the core substrate with the core pattern.

With reference to FIG. 8, pattern formation masks 42 are then applied to the surface of the core substrate 21. The mounting hole 29 is covered by the mask 42. Subsequently, the copper film 1 on the surface of the core substrate 21 is etched. This forms wall surface pads 118, the bonding pads 116, 117, and the core patterns 12, 16 on the surface of the core substrate 21, as shown in FIGS. 9 and 10. Referring to FIG. 11, on the surface of the core substrate 21, the ring-like reinforcing land 110 is formed at the periphery of a conductive hole formation portion 300 and the round coating pad 111 is formed at a conductive hole formation portion 310.

(2) Formation of the Laminated Layer

Figure 12:
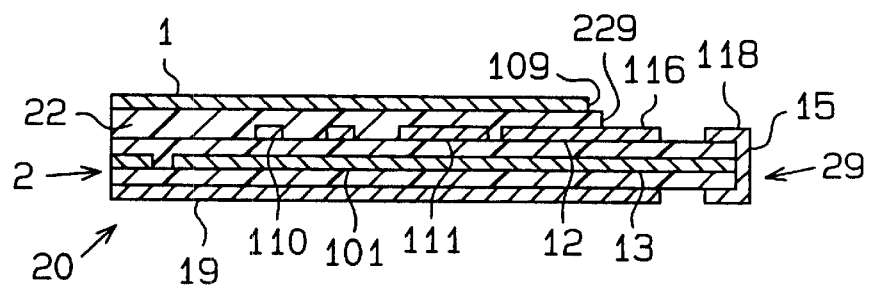
FIGS. 12 to 18 are cross-sectional views illustrating a method for manufacturing the multilayer printed circuit board according to the first embodiment of the present invention.

With reference to FIG. 12, the insulating layer 22 is formed on the surface of the core substrate 21, preferably by printing prepreg. The prepreg is in a semi-hard state in which resin is impregnated in a glass cloth. The insulating layer 22 may be epoxy resin impregnated with an aramide nonwoven fabric cloth. The insulating layer 21 may also be formed by printing a paste-like solder resist. Afterward, the mounting hole 29 and an opening 229, which exposes the bonding pads 116, 117 about the bonding pads 116, 117, are then formed in the insulating layer 22. The thickness of the insulating layer 22 is preferably 30 to 150 $\mu$m. If the thickness of the insulating layer 22 is less than 30 $\mu$m, insulation between the core pattern 12 and the surface pattern 11 becomes difficult. If the insulating layer thickness exceeds 150 $\mu$m, the distance between the core pattern 12 and the surface pattern 11 increases. This may hinder high speed transmission of electric signals.

Afterward, a copper foil 1 is applied to the surface of the insulating layer 22 to obtain a laminated plate 20. An opening 109 having about the same area as the opening 229 of the insulating layer 22 is preformed in the copper foil 1.

(3) Formation of the Surface Pattern

Figure 13:
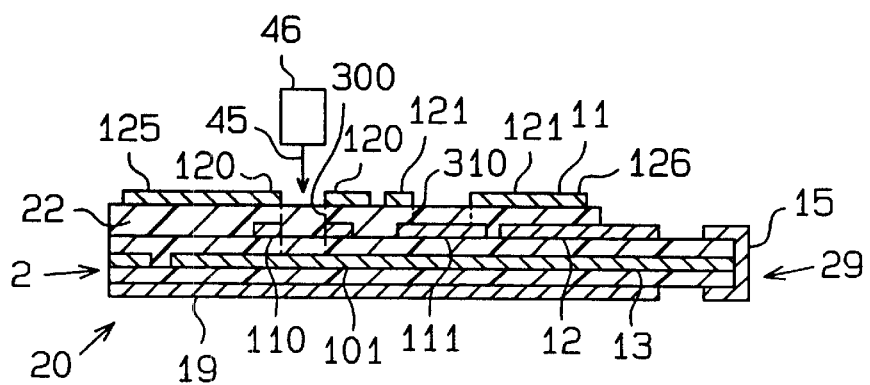

Referring to FIG. 13, part of the copper foil 1 is etched and removed to form the surface pattern 11 and the bonding pattern 126 on the insulating layer 22. The ring-like lands 120, 121 are formed about the conductive hole formation portions 300, 310. The solder ball connection pad 125 is also formed. The lands 120, 121 are electrically connected to the surface pattern 11.

(4) Milling of the Conductive Hole

With reference to FIG. 13, a laser oscillator 46 is used to irradiate a laser beam 45 at the conductive hole formation portions 300, 310 of the laminated plate 20. The laser beam 45 is irradiated locally at the conductive hole formation portions 300, 310. It is preferred that a carbon dioxide laser having relatively high output energy, an excimer laser having small thermal effects on substrates, or the like be used to generate the laser beam 45.

Figure 14:
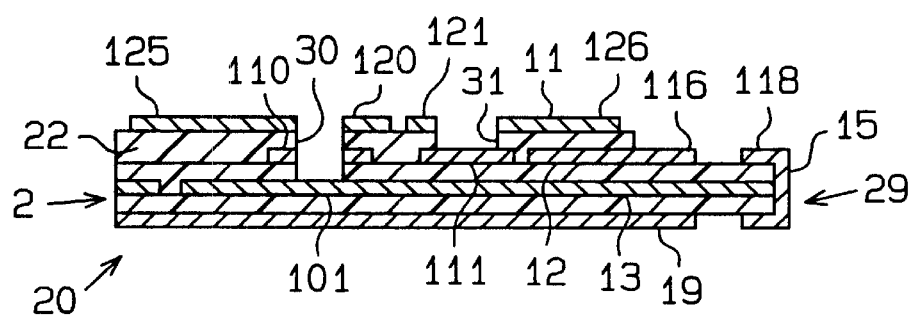
Figure 15:
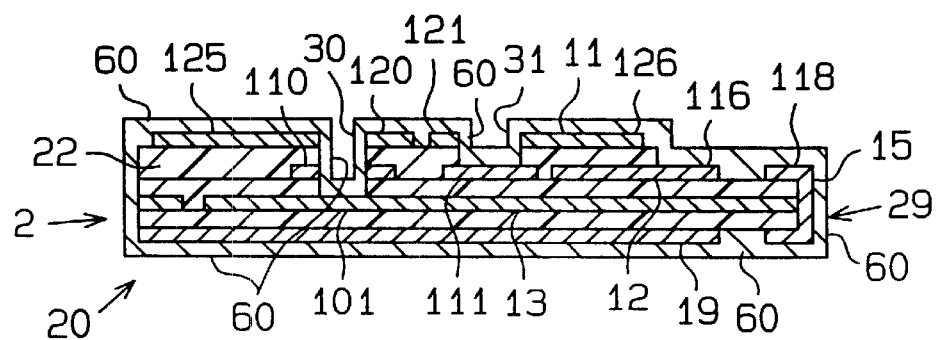

Irradiation by the laser beam 45 partially burns and removes the insulating layer 22 and/or the core substrate 21 to gradually form a hole in an inward direction. When reaching the coating pads 101, 111 covering the bottom opening of the hole formed in the conductive hole formation portions 300, 310, the laser beam 45 is reflected by the pads 101, 111. Accordingly, the pads 101, 111 stop the hole formation. With reference to FIG. 14, in this manner, the conductive holes 30, 31, preferably having diameters of 30 $\mu$m to 300 $\mu$m are formed. Surplus resin may also be removed from the insulating layer 22 by the laser beam 45. If the diameter of the conductive holes 30, 31 is less than 30 $\mu$m, it becomes difficult for plating liquid to flow into the conductive holes 30, 31. This may result in a non-uniform formation of a thin plating film 60, which will be described later, and hinder conduction in the vertical direction. If the diameter exceeds 300 $\mu$m, it becomes difficult to narrow the pitch of the conductive holes 30, 31 and arrange components at the conductive holes 30, 31 and the patterns 11, 12 with high density.

(5) Application of Thin Plating Film

The surface of the laminated plate 20 including the walls of the mounting hole 29 and the conductive holes 30, 31 undergo copper (Cu) chemical plating or tin (Sn) chemical plating. A palladium (Pd) catalyst is further applied to the surface to form the thin plating film 60, which is formed from a plurality of layers. The thin plating film 60 preferably has a thickness of 0.01 to 5 $\mu$pm. If the thickness of the thin plating film 60 is less than 0.01 $\mu$m, the thin plating film 60 may not be formed on the entire wall of each of the conductive holes 30, 31. If the thickness exceeds 5 $\mu$m, removal through etching after the application of the conductive film may be difficult.

(6) Formation of Conductive Film in the Conductive Holes

Figure 16:
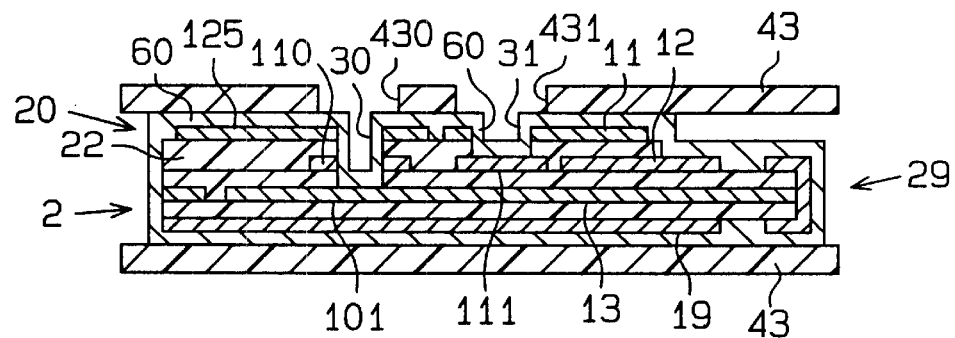

Then, referring to FIG. 16, a mask 43 having openings 430, 431 corresponding to the conductive holes 30, 31 is applied to the surface of the laminated plate 20 and preferably undergoes electroplating or chemical plating. This forms a conductive coating 67 on the inner walls of the conductive holes 30, 31.

(7) Removal of the Mask

Afterward, a solvent is used to dissolve and remove the mask 43.

(8) Removal of the Thin Plating Film

Figure 17:
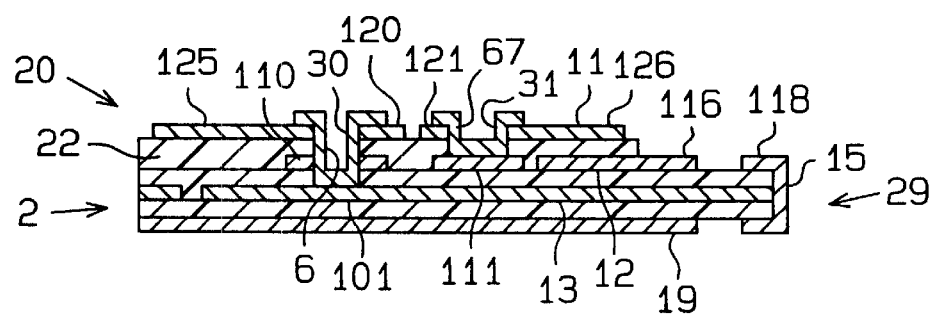

Afterward, referring to FIG. 17, soft etching is performed to remove part of the thin plating film 60, or the part not covered by the conductive coating 67, so that the conductive coating 67 remains.

(9) Surface Post-treatment of the Laminated Plate

Figure 18:
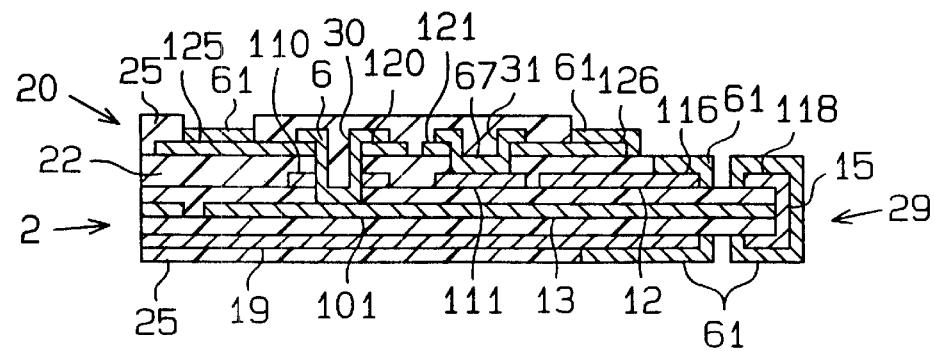

Afterward, referring to FIG. 18, the surface of the laminated plate 20 is covered with the solder resist 25. In this state, the solder ball connection pad 125, the bonding pads 126, 116, 117, and the wall surface pattern 15 are not covered with the solder resist 25.

Then, a connection metal coating 61 formed from a Ni/Au plating i applied to the surfaces of the solder ball connection pad 125, the bonding pads 126, 116, 117, and the wall surface pattern 15 and the wall surface pads 118.

Then, referring to FIG. 4, the solder ball 63 is connected to the surface of the pad 125. Further, the heat radiating plate 59, which covers the mounting hole 29, is secured to the lower surface of the laminated plate 20.

The multilayer printed circuit board 50 is obtained in this manner.

The operation and effects of the first embodiment will now be discussed.

After laminating the insulating layer 22 on the surface of the core substrate 21 as shown in FIG. 12, the conductive holes 30, 31 and the surface pattern 11 are formed as shown in FIG. 14. The core substrate 21 reinforces the insulating layer 22. Accordingly, the insulating layer 22 is capable of resisting the impacts produced when the conductive holes 30, 31 and the surface patterns 11, 19 are machined.

Therefore, the insulating layer 22 is thinner in comparison with that of the prior art. Accordingly, the distance between patterns is decreased and the signal transmission speed is increased.

The core substrate 21 laminated on the insulating layer 22 is relatively thick. This facilitates handling of the substrate 21 when forming the conductive holes 30, 31 and the surface pattern 11.

Further, the formation of the conductive holes 30, 31 at the conductive hole formation portions 300, 310 is performed until the laser beam 45 reaches the coating pads 101, 111. Hence, by arranging the coating pads 101, 111 at different vertical positions. conductive holes 30, 31 of different depths are easily formed.

The radiation of the laser beam 45 forms the small conductive holes 30, 31. Further, there is no residual insulating material. Accordingly, the reliability of the electrical connection between the coating pads 101, 111 and the conductive coating 67 is high.

The first embodiment enables minute conductive holes to be easily milled. Further, the decreased dimension of the conductive holes narrows the pitch of the conductive holes and enables high density mounting of pads.

Furthermore, by repeating the procedures illustrated in FIGS. 12 to 17, new surface patterns and additional conductive holes may be formed in the surface pattern 11. This facilitates the manufacture of the printed circuit board 50.

Further, as shown in FIG. 11, the land 110 surrounds the middle of the conductive hole 30. Thus, the thin plating film 60 and the conductive coating 67 are uniformly formed on the inner wall of the conductive hole 30 even if the conductive hole is relatively deep. This improves the conductive reliability. Since the reinforcing land 110, the thin plating film 60, and the conductive coating 67 are each formed from metal, they each have substantially the same coefficient of thermal expansion. Thus, the reinforcing land 110 inhibits the exfoliation of the conductive coating 67 that would be caused by thermal impact.

It is preferred that the insulating layer 22 be made of epoxy resin impregnated with aramide nonwoven fabric cloth or the like. Thus, the insulating layer 22 is not hardened during the laser irradiation and productivity is increased.

In the first embodiment, the wall surface pattern 15 is formed on the wall of the mounting hole 29 as shown in FIGS. 5 to 9. However, the upper and lower portions of the core substrate 21 may be connected with each other through conductive holes instead of by the wall surface pattern 15.

In this example, the insulating layer 22 may be formed on both sides of the core substrate 21 and a surface pattern may be formed on both insulating layers.

The mounting holes 29 for mounting electronic components on the core substrate 21 may be a through hole or a recess-like non-though hole.

Second Embodiment

A multilayer electronic component mounting substrate according to a second embodiment of the present invention will now be described with reference to FIG. 19 to FIG. 31.

Figure 19:
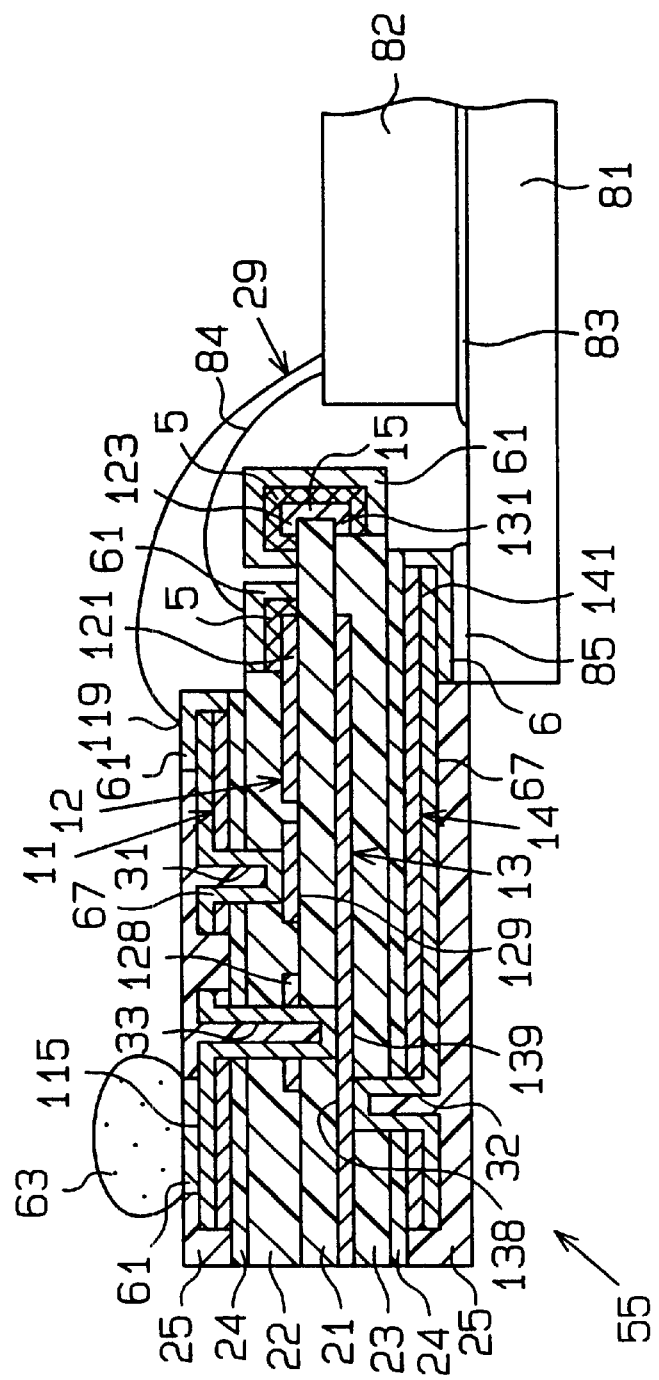
FIG. 19 is a schematic cross-sectional view showing a multilayer electronic component mounting substrate according to a second embodiment of the present invention.

With reference to FIG. 19, the multilayer electronic component mounting substrate 55 includes a mounting hole 29 to enable the mounting of an electronic component 82, a core substrate 21 having core patterns 12, 13, and surface patterns 11, 14 laminated on insulating layers 22, 23, which are arranged on the surface of the core substrate 21.

The multilayer electronic component mounting substrate 55 includes conductive holes 31, 32, 33, which electrically connect the core patterns 12, 13 to the surface patterns 11, 14, and connection terminals 119, 121, 122, 141, exposed to the interior and periphery of the mounting hole 29.

The connection terminals 121, 122 are coated with an electroless plating film 5, which is formed from electroless Ni—Au plating or electroless Ni—Pd plating. A wall surface pattern 15 is formed on the inner wall of the mounting hole 29. The upper and lower ends of the wall surface pattern 15 are connected to wall pads 123, 131 formed on the upper and lower surfaces of the core substrate 21. The wall surface pattern 15 and the wall pads 123, 131 are also coated with the electroless plating film 5, which is formed from electroless Ni—Au plating or electroless Ni—Pd plating.

The bottoms of the conductive holes 31, 32, 33 are covered by coating pads 129, 138, 139.

Figure 21:
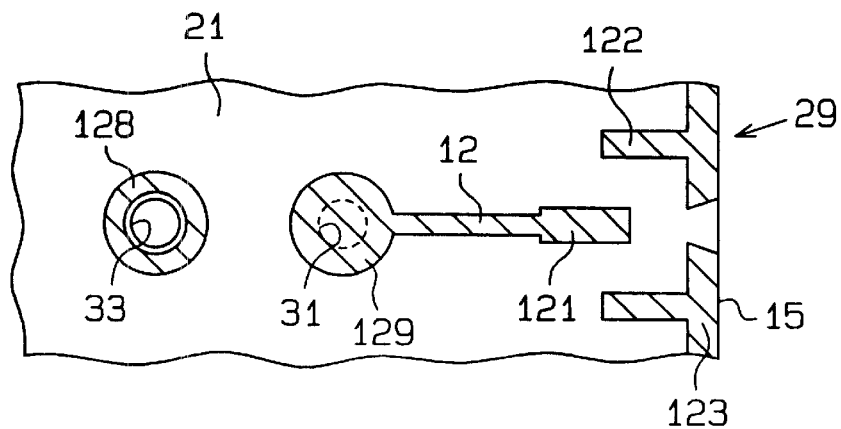
FIG. 21 is a plan view showing a core substrate having a core pattern.

As shown in FIG. 19 and FIG. 21, the surface pattern 11 includes a connection pad 115 for connecting an external connection solder ball 63. A heat radiating plate 81, which covers the mounting hole 29, is secured to the lower surface of the multilayer electronic component mounting substrate 55.

The surface of the multilayer electronic component mounting substrate 55 is coated with a solder resist 25.

Figure 20:
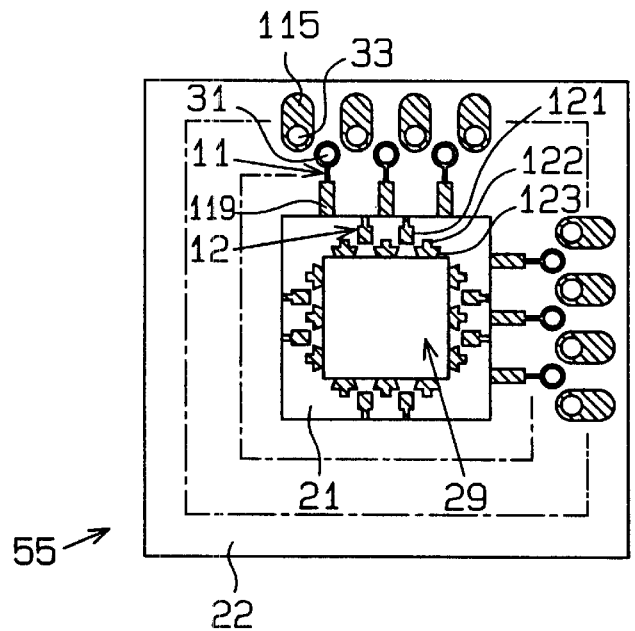
FIG. 20 is a plan view showing the multilayer electronic component mounting substrate of FIG. 19.

Referring to FIG. 19 and FIG. 20, the core pattern 12 includes the coating pad 129, which covers the bottom opening of the conductive hole 31, a reinforcing land 128, which surrounds the middle of the conductive hole 33, the connection terminals 121, 122, and the wall pad 123 connected to the connection terminal 122.

The method for manufacturing the multilayer electronic component mounting substrate 55 will now be described.

First Process

An insulating substrate, which serves as the core substrate 21 is first prepared.

Figure 22:
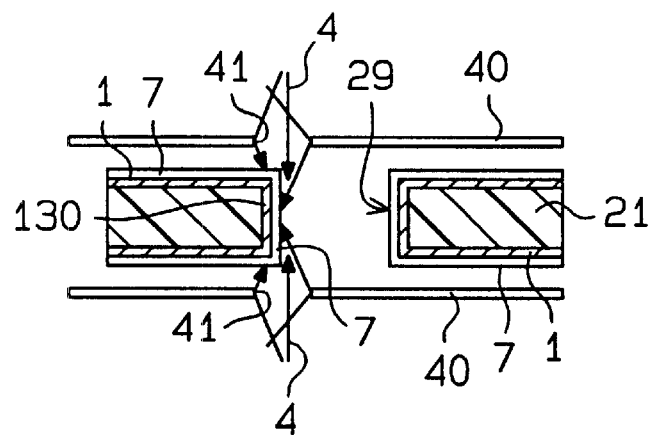
FIG. 22 is a cross-sectional view showing the core substrate and illustrating a method for forming a wall surface pattern.

As shown in FIG. 22, a copper foil 1 is applied to both surfaces of the core substrate 21. Then, the mounting hole 29 is milled using a router. A metal plating 130 is then applied to the surface of the core substrate 21, which includes the wall of the mounting hole 29, by performing copper chemical plating and copper electroplating.

Figure 23:
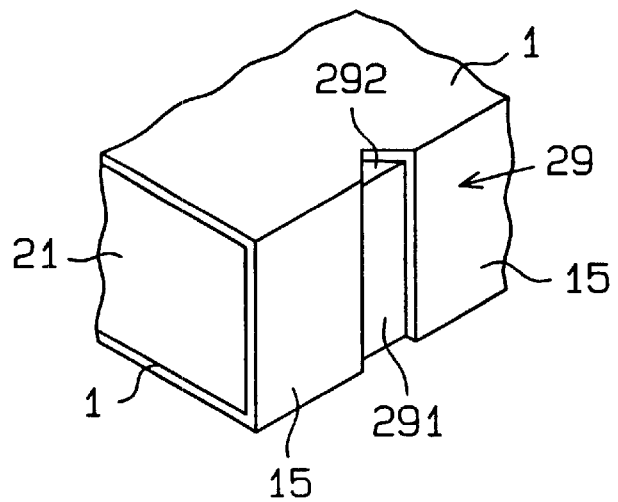
FIG. 23 is a partial perspective view showing the core substrate with the wall surface pattern.

A resist film 7 is then applied to the surface of the metal plating 130. The core substrate 21 is irradiated with a scattered light 4 using a mask 40, which has a slit 41. The mask 40 is then removed, and the resist film 7 is selectively removed. The metal plating 130 and the copper foil 1 not covered by the resist film 7 are then etched and removed to form the wall surface pattern 15 and an exposed surface 292 as shown in FIG. 23.

The resist film 7 is then removed by an alkalic solvent to expose the copper foil 1.

Figure 24:
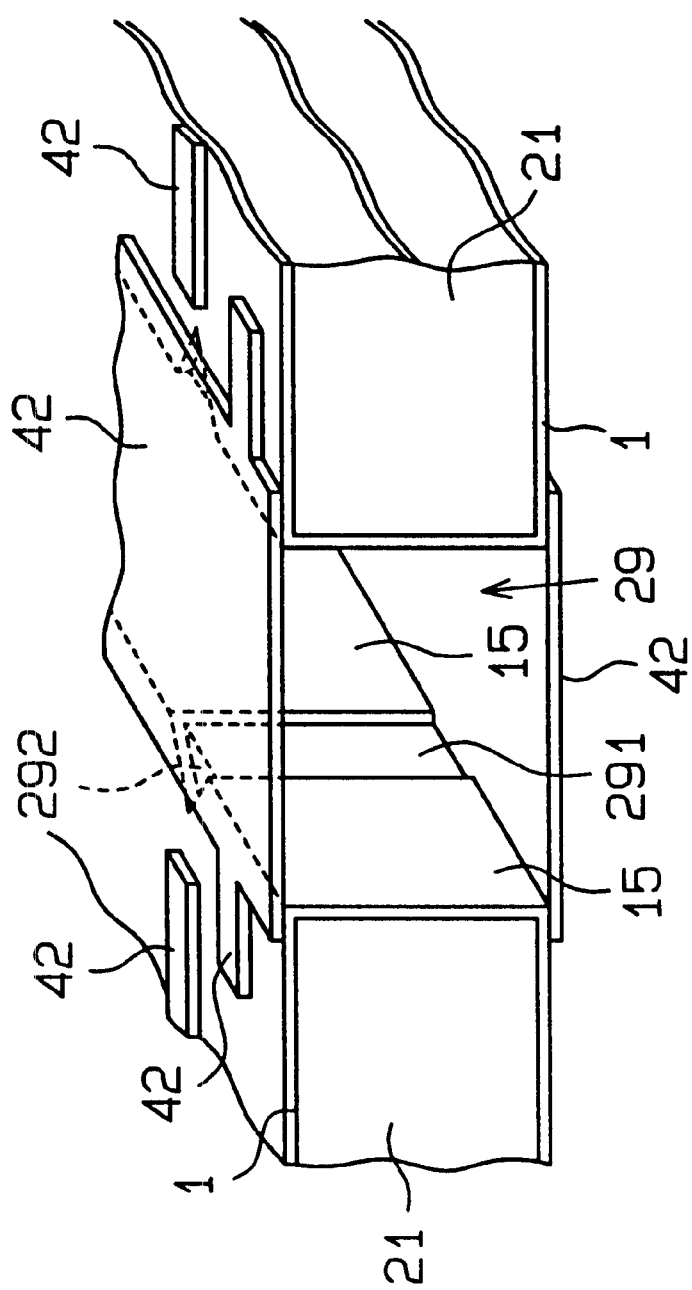
FIG. 24 is a partial perspective view showing a core substrate with the core pattern.
Figure 25:
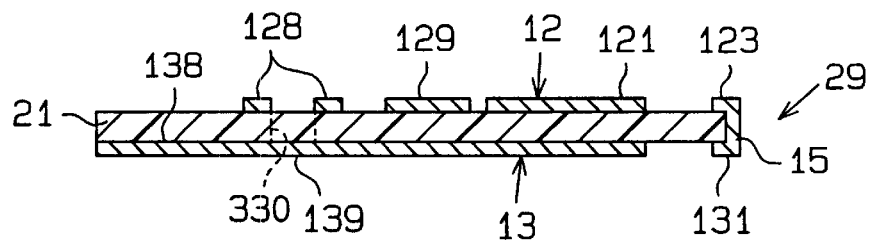
FIGS. 25 to 31 are cross-sectional views illustrating a method for manufacturing the multilayer electronic component mounting substrate according to the second embodiment of the present invention.

Then, as shown in FIG. 24, the copper foil 1 is etched using a mask 42, which covers the mounting hole 29, to form the core, pattern 12, which includes the connection terminals 121, 122, the wall pad 123, the coating pad 129, and the reinforcing land 128, as shown in FIG. 25 and FIG. 21 on the upper surface of the core substrate 21.

With reference to FIG. 21, the coating pad 129 is circular to cover the bottom opening of the conductive hole 31. The reinforcing land 128 is annular and surrounds the side wall of the conductive hole 33. Referring to FIG. 25 and FIG. 19, the core pattern 13, which includes the circular coating pads 138, 139 and the wall pad 131, is formed on the lower surface of, the core substrate 21.

Second Process

Figure 26:
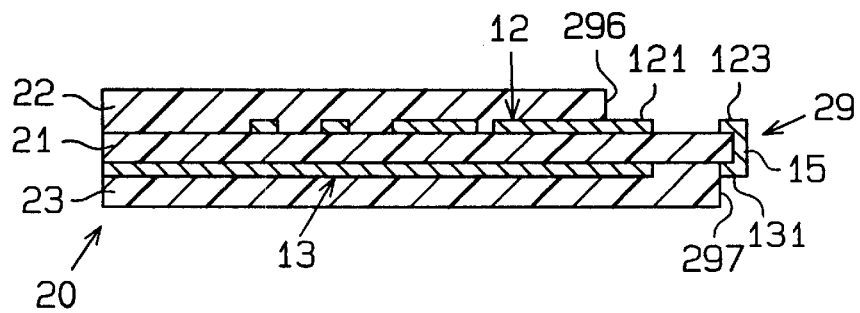

Referring to FIG. 26, prepregs are laminated on both surfaces of the core substrate 21 to form the insulating layers 22, 23 and obtain the laminated plate 20. An opening 296 having an area larger than the mounting hole 29 is preformed on the prepreg that corresponds to the upper insulating layer 22. An opening 297 having an area smaller than the mounting hole 29 is preformed on the prepreg that corresponds to the lower insulating layer 23.

Third Process

Figure 27:
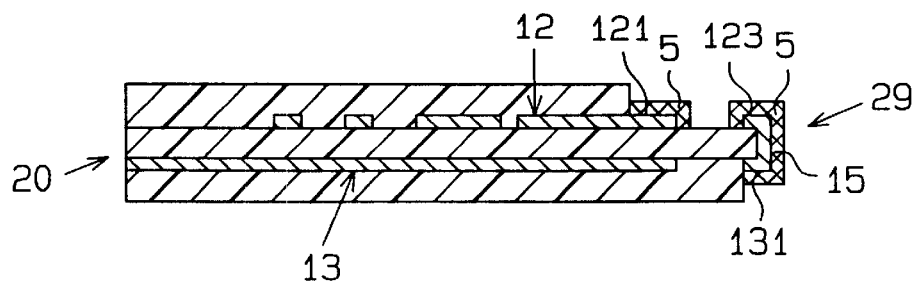

Then, as shown in FIG. 27, the electroless plating film 5 is applied to the connection terminals 121, 122, which are exposed to the interior of the mounting hole 29, the wall surface pattern 15, and the surface of the wall pads 123, 131 by performing electroless Ni—Au plating or electroless Ni—Pd plating.

Electroless Ni—Au plating refers to a nickel plating film and a gold plating film formed through electroless plating. Electroless Ni—Pd plating refers to a nickel plating film and a palladium plating film formed through electroless plating.

Fourth Process

Figure 28:
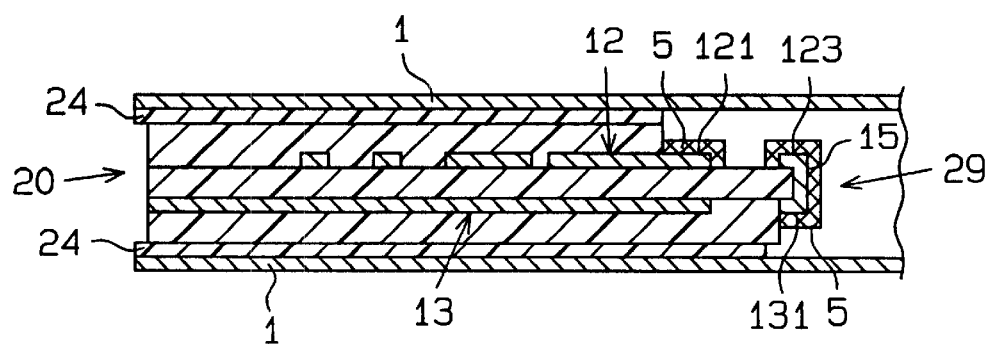

Afterward, with reference to FIG. 28, an adhesive sheet 24 formed from a prepreg is laminated on the upper and lower surfaces of the laminated plate 20. The copper foil 1 is secured to the adhesive sheet 24. In this state, the mounting hole 29 is covered by the copper foil 1.

Figure 29:
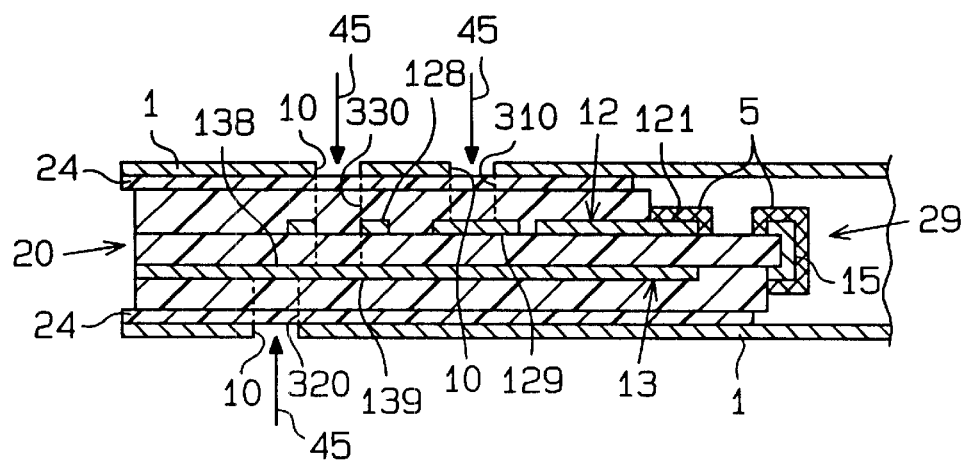

Then, referring to FIG. 29, etching is performed to form an opening 10 in conductive hole formation portions 310, 320, 330.

Fifth Process

Afterward, a laser beam 45 is irradiated on the conductive hole formation portions 310, 320, 330 of the laminated plate 20 to form the conductive holes 31–33. The entire surface of the laminated plate 20 excluding the conductive hole formation portions 310, 320, 330 is covered by the copper foil 1. Thus, the laser beam 45 does not damage the laminated plate 20.

Sixth Process

Figure 30A:
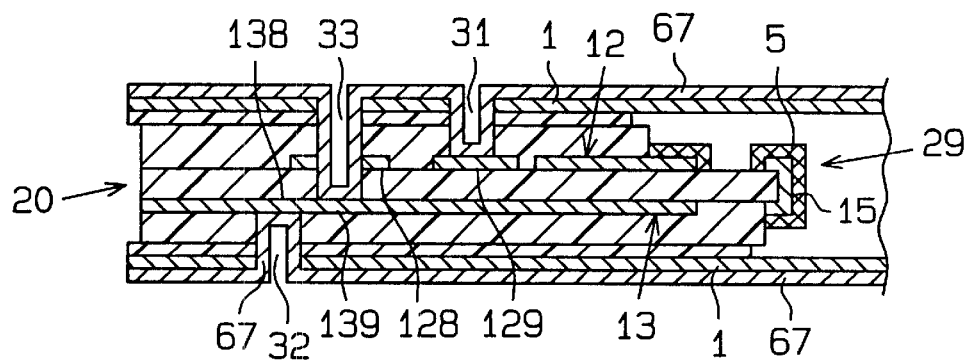

Then, as shown in FIG. 30(a), copper chemical plating, the application of a palladium catalyst, and copper electroplating are performed on the surface of the laminated plate 20, which includes the walls of the conductive holes 31–33, to form the conductive coating 67. The reinforcing land 128, which surrounds the middle of the relatively deep conductive hole 33, enhances the deposition of the chemical plating and forms the conductive coating 67 on the wall of the conductive hole 33 in a uniform manner. This is because the distance between the reinforcing land 128 and the surface pattern 11 and the distance between the reinforcing land 128 and the conductive pattern 13 are shortened and the gap between conductive members is small.

Figure 30B:
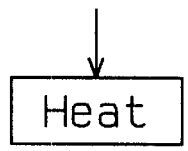

Afterward, referring to FIG. 30(b), the laminated plate 20 is heated at 150° C. for 60 minutes or longer or at 160° for 30 minutes or longer.

Seventh Process

Figure 31:
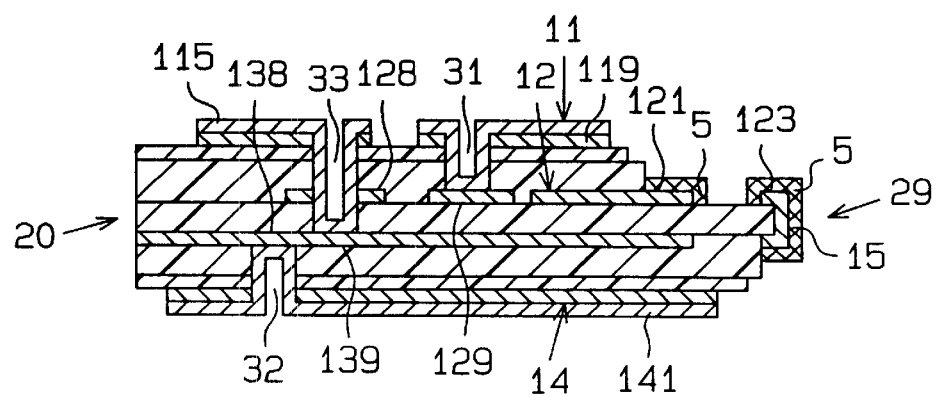

Then, as shown in FIG. 31, etching is performed on the copper foil 1 to form the surface pattern 11, which includes the connection terminal 119 and the solder ball connection pad 115, and the surface pattern 14, which includes the connection terminal 141.

Afterward, as shown in FIG. 19, the surface of the laminated plate 20 is coated with the solder resist 25. Then, a metal coating 61 formed from a nickel/gold plating film is applied to the surface of the connection pad 115, the connection terminals 119, 141, 121, 122, the wall pads 123, 131, and the wall surface pattern 15. Subsequently, the solder ball 63 is connected to the surface of the connection pad 115 with the metal coating 61. The metal heat radiating plate 81, which covers the mounting hole 29, is secured to the lower surface of the laminated plate 20 by an adhesive 85, which is made of an epoxy insulative resin or the like. The upper surface of the heat radiating plate 81 covers the bottom opening of the mounting hole 29. The electronic component 82 is secured to the surface of the heat radiating plate 81 by a silver paste or the like.

The multilayer electronic component mounting substrate 55 is obtained in this manner.

The operation and effect of the present invention will now be described.

As shown in FIG. 27, the connection terminal 121, 122, which are exposed to the interior of the mounting hole 29, are coated by an electroless plating film 5 and then heated. The heat disperses copper on the surface of the film 5 when the copper of the connection terminal infiltrates the electroless plating film 5. Accordingly, self-sintering of the electroless plating film 5 is enhanced and a fine film structure is obtained. This improves the corrosion resisting characteristic of the electroless plating film 5 relative to the etching liquid used during surface pattern formation. Accordingly, the surfaces of the connection terminals 121, 122 exposed to the interior of the mounting hole 29 are not corroded. Thus, the bonding strength of a bonding wire 84 relative to connection terminals increases.

The surfaces of the connecting terminals 121, 122 are coated by the electroless plating film 5. Thus, in addition to having a superior corrosion characteristic, a plating lead is not required.

It is preferred that the laminated plate 20 be heated at a temperature of 150° C. to 250° C. This improves the corrosion resisting characteristic of the connection terminals 121, 122. If the temperature is lower than 150° C., the dispersion of gold in the electroless plating film 5 becomes insufficient and may result in the connection terminals being corroded by the etching liquid. If the temperature exceeds 250° C., there is a large possibility that heat may affect the insulating layers 22, 23. Thus, the heat treatment must be performed within a short period of time.

Pattern 15 and the wall pads 123, 131 do not have to be formed.

A surface pattern may be provided by means of the insulating layer on only one side of the core pattern.

Any one of the second process and the third process may be performed first. It is required only that the laminated plate 20 be heated after the formation of the electroless plating film 5 and before the formation of the surface patterns 11, 14.

Third Embodiment

Figure 32:
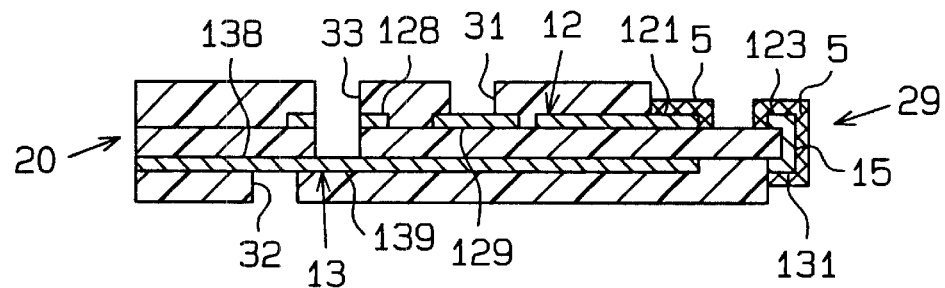
FIGS. 32 and 33 are cross-sectional views illustrating a method for manufacturing the multilayer electronic component mounting substrate according to a third embodiment of the present invention.
Figure 33:
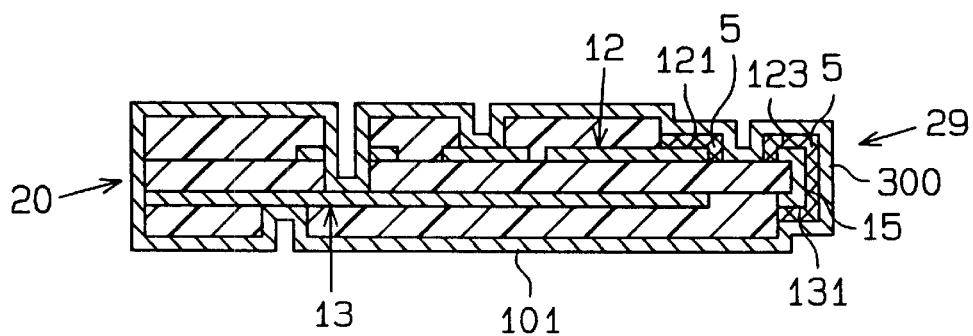

In the third embodiment, after performing the fifth process, during which the conductive holes 31, 32, 33 are milled in the laminated plate 20, as shown in FIG. 32, the fourth process, during which a metal layer 300 is formed with a plating treatment, is performed as shown in FIG. 33.

In other words, after performing the first to third processes of the second embodiment, the fifth process is performed and the fourth process is performed afterward. The laminated plate 20 is heated before the fourth process and before or after the fifth process. The heating conditions are 150° C. for 60 minutes or longer or 160° C. for 30 minutes or longer.

Subsequently, the sixth process and the seventh process of the second embodiment are performed. Other matters are the same as the second embodiment.

In the third embodiment, the electroless plating film 5 is heated before forming the surface patterns 11, 14 through etching. This prevents etching liquid from corroding the connection terminals 119, 121, 122, 141.

It is preferred that the surface of the electroless plating film 5 be ground before forming the surface patterns 11, 14. This removes the copper included in the electroless plating film 5. Accordingly, corrosion of the connection terminals 121, 122 by the etching liquid, which includes copper, is effectively prevented. The connection terminals 121, 122 may be ground through argon plasma or mechanical grinding using abrasive grains or the like.

Fourth Embodiment

Figure 34:
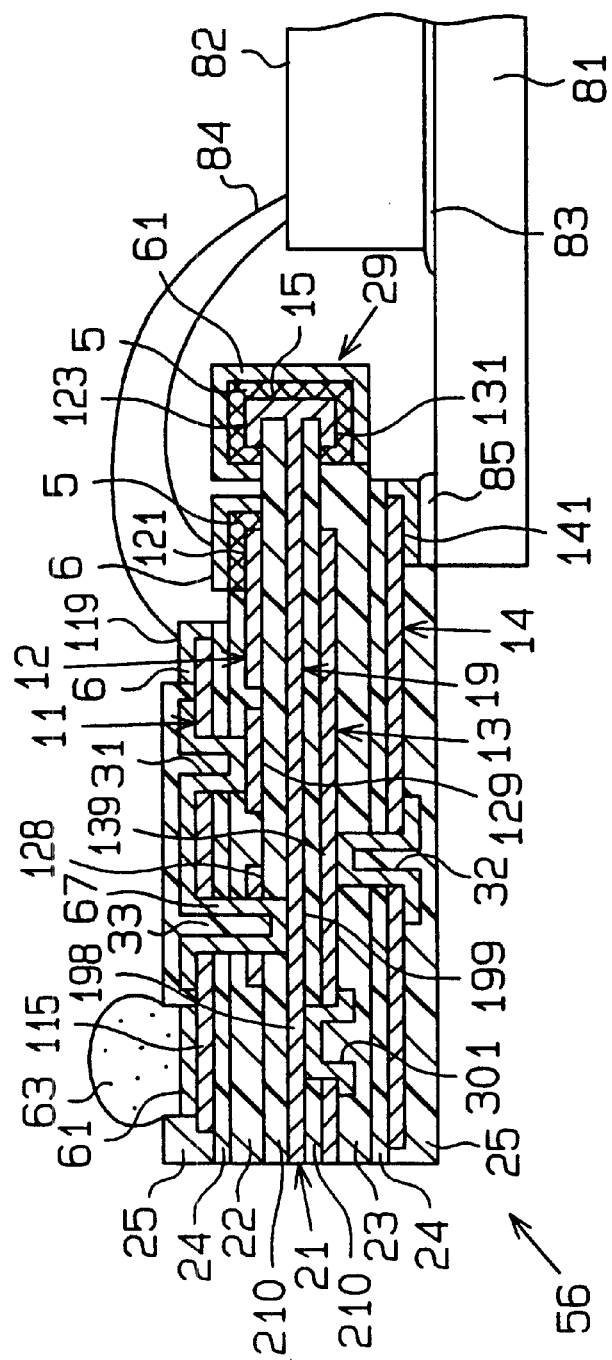
FIG. 34 is a schematic cross-sectional view showing a multilayer electronic component mounting substrate according to a fourth embodiment of the present invention.

As shown in FIG. 34, a multilayer electronic component mounting substrate 56 according to the fourth embodiment is similar to the structure of the second embodiment except in that a core pattern 19 is also provided in the interior of the core substrate 21.

With reference to FIG. 34, the multilayer electronic component mounting substrate 56 includes a core substrate 21 having core patterns 12, 13, 19, insulating layers 22, 23 applied to the upper and lower surfaces of the core substrate 21, surface patterns 11, 14 arranged on the surfaces of the insulating layers 22, 23, and connection terminals 119, 121, 122, 141 exposed to the interior and from the mounting hole 29.

The core pattern 19 in the core substrate 21 includes covering pads 198, 199 for covering the bottom openings of conductive holes 301, 33. The core pattern 19 is connected to the connection terminal 122 electrically via a wall surface pattern 15 and the wall pad 123 (refer to FIG. 20).

The surface pattern 11 includes a connection pad 115 for connecting the external connection solder ball 63. The core pattern 12 includes a ring-like reinforcing land 128 surrounding the middle of the conductive hole 33, a cover pad 129 covering the bottom opening of the conductive hole 31, a wall pad 123 connecting the connection terminal 121 to the wall surface pattern 15, and the connection terminal 122 (refer to FIG. 20). The multilayer electronic component mounting substrate 56 the fourth embodiment has a planar structure that is the same as that of the second embodiment.

The connection terminals 121, 122 are connected electrically by the electronic component 82 via the bonding wire 84. The surfaces of the connection terminals 121, 122 are coated with an electroless plating film 5, which is formed by an electroless Ni—Au plating or an electroless Ni—Pd plating.

A method for manufacturing the multilayer electronic component mounting substrate 56 will now be discussed.

First Process

Figure 35:
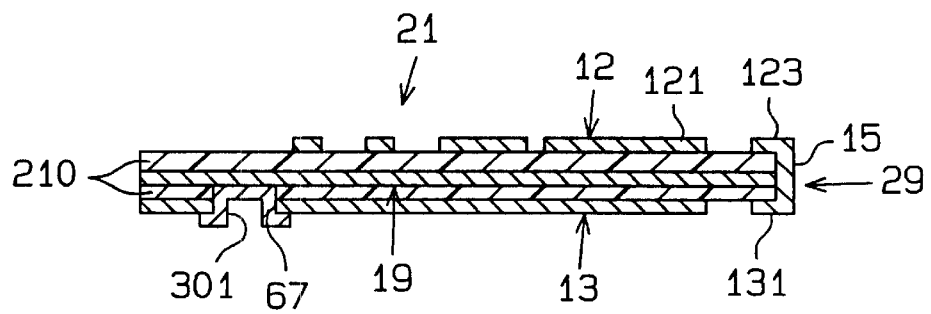
FIGS. 35 to 39 are cross-sectional views showing a method for manufacturing the multilayer electronic component mounting substrates according to the fourth embodiment of the present invention.

As shown in FIG. 35, the core pattern 19 is first formed between the insulating layers 210. In the same manner as the second embodiment, the core patterns 12, 13 and the core substrate 21 are formed.

Then, the conductive hole 301 is formed by irradiating a laser on the core substrate 21. A conductive coating 67 is then applied to the wall of the conductive hole 301.

Second Process

Figure 36A:
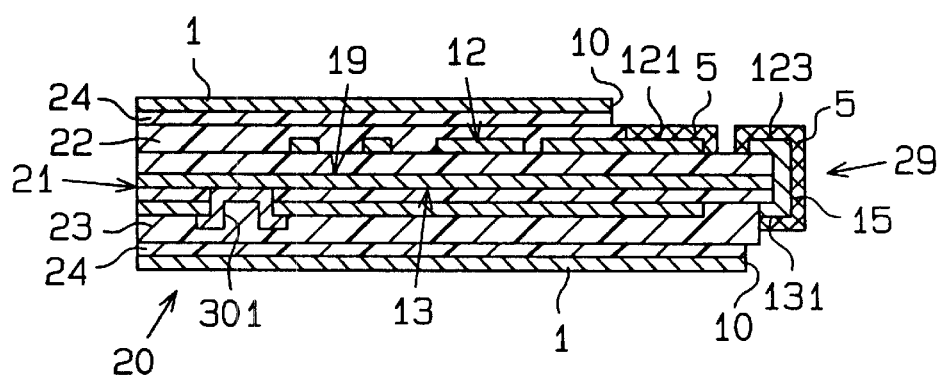

Afterward, as shown in FIG. 36(a), insulating layers 22, 23 are applied to the upper and lower surfaces of the core substrate 21 with the mounting hole 29 of the core substrate 21 in an opened state.

Third Process

Subsequently, a copper foil 1 is secured to the surfaces of the insulating layers 22, 23 by an adhesive sheet 24, which is made of prepreg. The adhesive sheet 24 and the copper foil 1 has an opening 10 that exposes the mounting hole 29 prior to lamination. This forms the laminated plate 20.

Fourth Process

Electroless Ni—Au plating or electroless Ni—Pd plating is then performed to apply an electroless plating film 5 to the connection. terminals 121, 122 exposed to the interior of the mounting hole 29, the wall surface pattern 15, and the surfaces of the wall pads 123, 131.

Figure 36B:
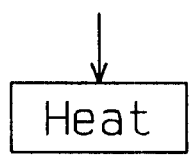

Afterward, referring to FIG. 36(b), the laminated plate is heated at 150° C. for 60 minutes or longer or at 160° C. for 30 minutes or longer.

Fifth Process

Figure 37:
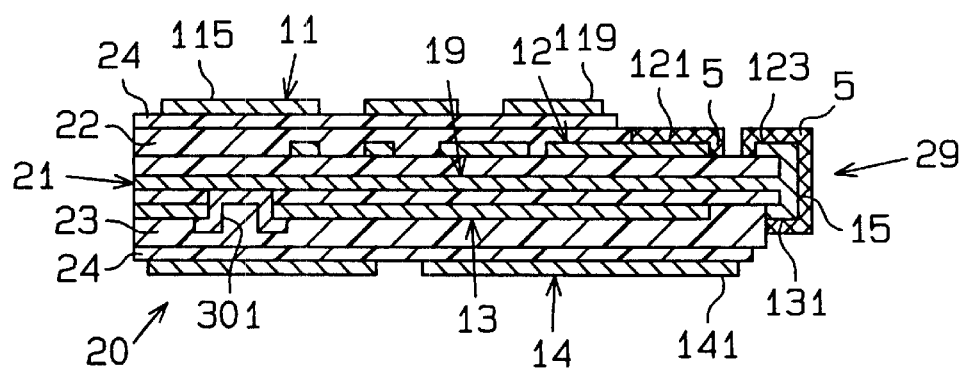

Then, as shown in FIG. 37, the copper foil 1 is etched to form the surface patterns 11, 14.

Sixth Process

Figure 38:
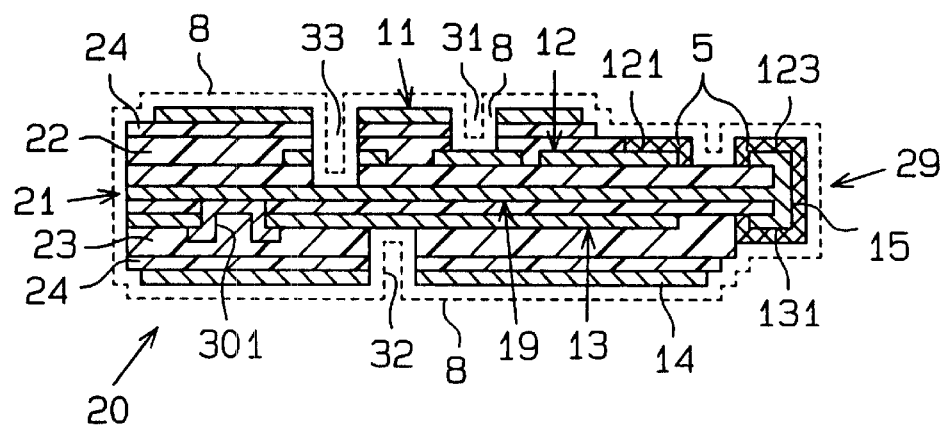

Afterward, as shown in FIG. 38, a laser beam is irradiated on the laminated plate 20 to mill the conductive holes 31–33. A copper chemical plating film 8 is then applied to the surface of the core substrate 21 including the wall of the mounting hole 29.

Seventh Process

Figure 39:
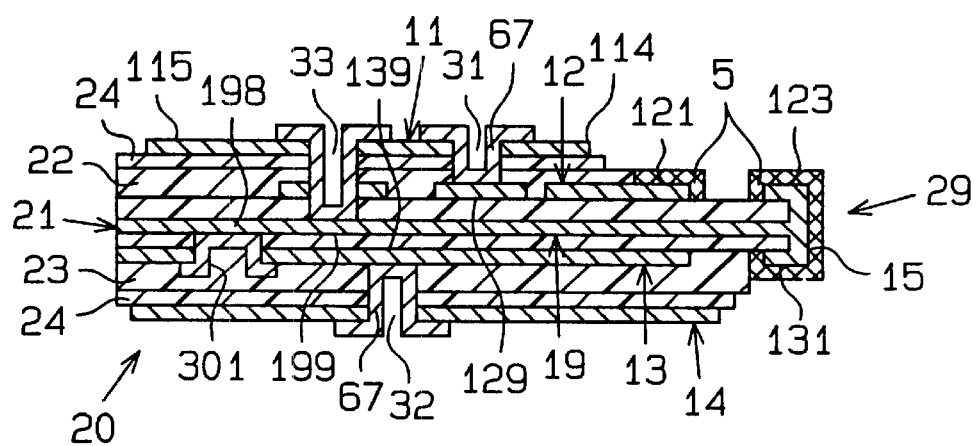

Then, as shown in FIG. 39, the entire surface of the laminated plate 20 excluding the conductive holes 31–33 is coated by a mask. Electroplating treatment is performed on the wall of the conductive holes 31–33 to form the conductive coating 67. The mask is then removed and soft etching, or the like is performed to remove the copper chemical plating film 8.

Afterward, as shown in FIG. 34, the solder resist 25 is formed, the heat radiating plate 81 is secured, and the solder ball 63 is,connected to obtain the multilayer electronic component mounting substrate 56.

The operation and effect of this embodiment will now be described.

In the fourth embodiment, after heating the connection terminals 121, 122, 141, which are coated with the electroless plating film 5, the surface patterns 11, 14 are formed by etching the copper foil 1. This prevents the etching liquid from corroding the connection terminals 121, 122, 141.

In the fourth embodiment, as shown in FIG. 36(a), the copper foil 1 is etched to form the surface patterns 11, 14. However, the entire surface of the laminated plate 20 may be coated by a copper plating film, and the copper plating film may be etched to form the surface patterns 11, 14.

Fifth Embodiment

A multilayer electronic component mounting substrate according to a fifth embodiment of the present invention will now be described with reference to FIGS. 40–49.

The multilayer electronic component mounting substrate 57 according to the fifth embodiment includes insulating layers 22, 23 provided on the upper and lower surfaces of a core substrate 21. The insulating layers 22, 23 have openings 296, 297 with recess-like machining marks 296a, 297a. The machining marks 296a, 296b are left when removing covers 218, 219, which are provided to protect patterns in the interior of the mounting hole 29.

(1) Formation of the Core Substrate

Figure 41:
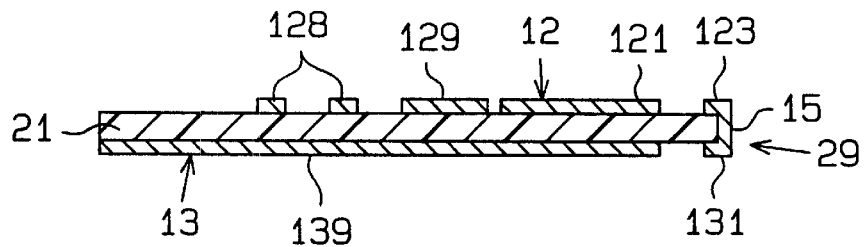
FIGS. 41 to 46 are cross-sectional views showing a method for manufacturing the multilayer electronic component mounting substrate according to the fifth embodiment of the present invention.

As shown in FIG. 41, a core substrate 21 having the same core patterns 12, 13 is formed in the same manner as the first embodiment.

(2) Formation of the Laminated Plate

Figure 42:
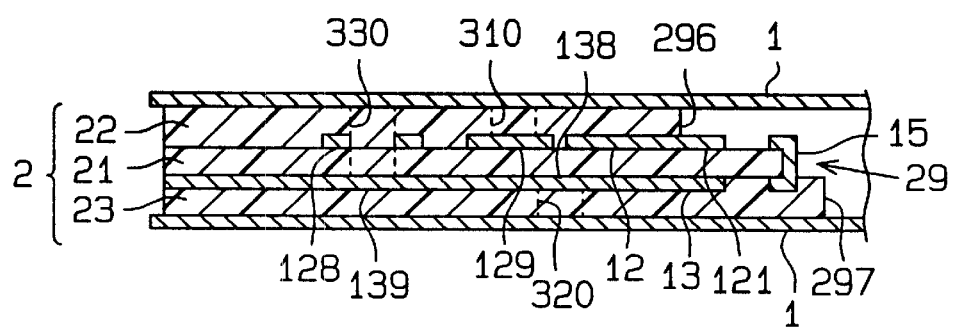

Then, as shown in FIG. 42, insulating layers 22, 23 are formed on the upper and lower surfaces of the core substrate 21 to obtain the laminated plate 20. The opening 296 having an area larger than the mounting hole 29 is preformed in the insulating layer 22. The opening 297 having an area smaller than the mounting hole 29 is preformed in the insulating layer 23.

(3) Application of Metal Foil

Copper foils 1 are secured to the upper and lower surfaces of the laminated plate 20 by adhesive 24. The adhesive sheets of the fifth embodiment are not shown in the drawings. In this state, the mounting hole 29 is covered by the copper foils 1.

Figure 43:
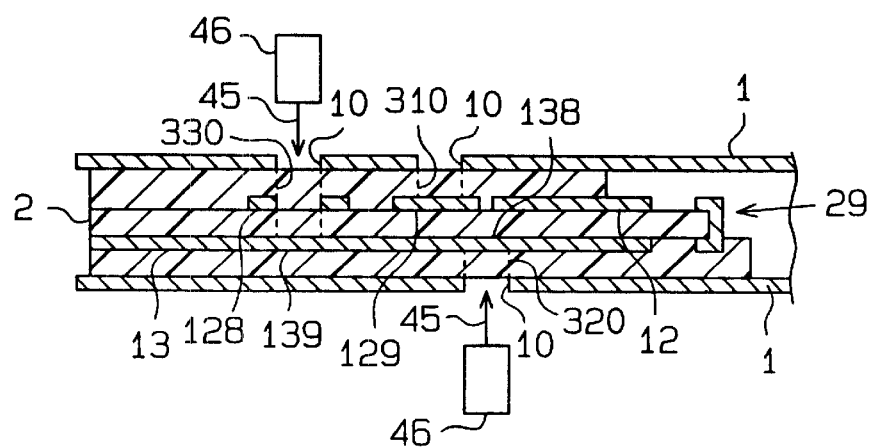

Then, as shown in FIG. 43, an etching treatment is performed using a mask to form openings 10 in the copper foils 1 at conductive hole formation portions 310, 320, 330.

(4) Formation of the Conductive holes

Figure 44:
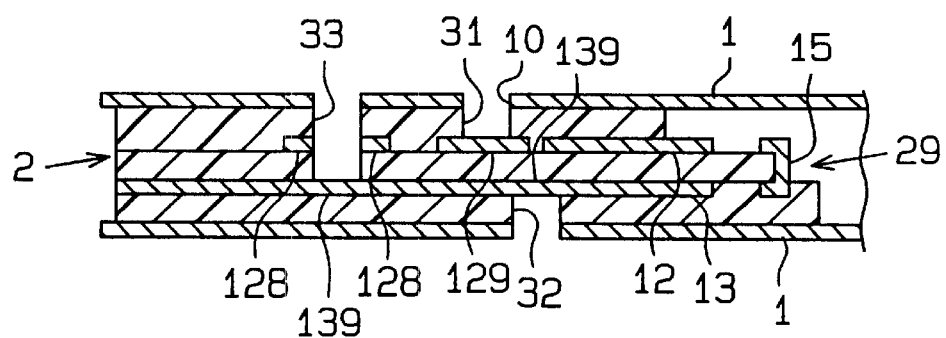

With reference to FIG. 44, a laser oscillator 46 is employed to irradiate a laser beam 45 at the conductive hole formation portions of the laminated plate 20 and form conductive holes 31–33 having diameters of 30 to 300 $\mu$m.

Figure 45:
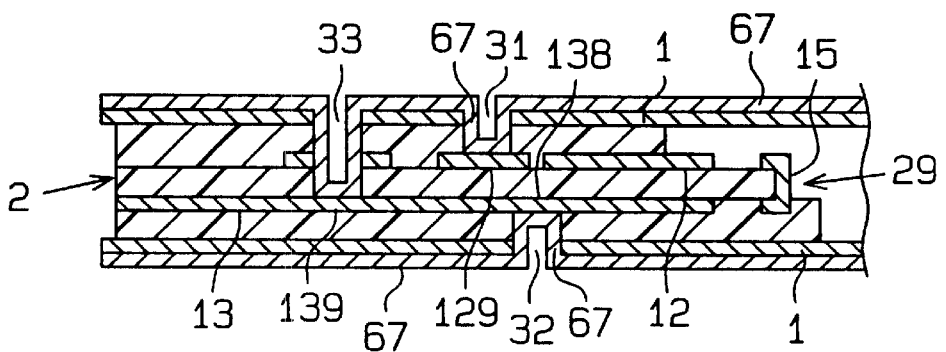

Then, as shown in FIG. 45, copper chemical plating, the application of a palladium catalyst, and copper electroplating are performed on the surface of the laminated plate 20, which includes the walls of the conductive holes 31–33, to form conductive coatings 67.

(5) Formation of Surface Pattern and Cover

Figure 46:
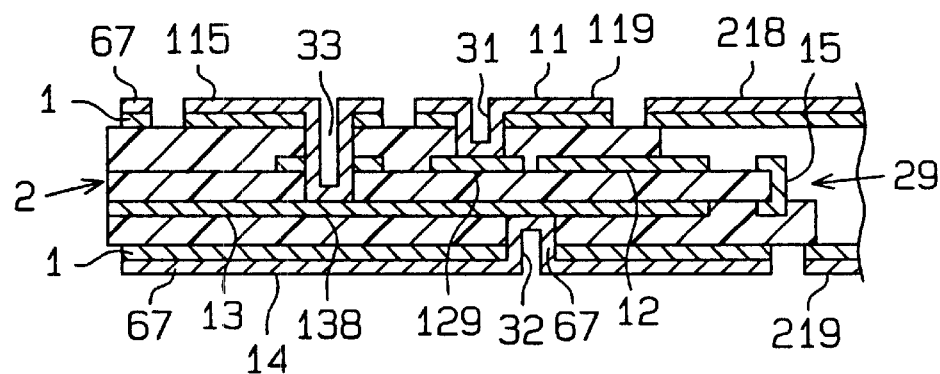
Figure 47:
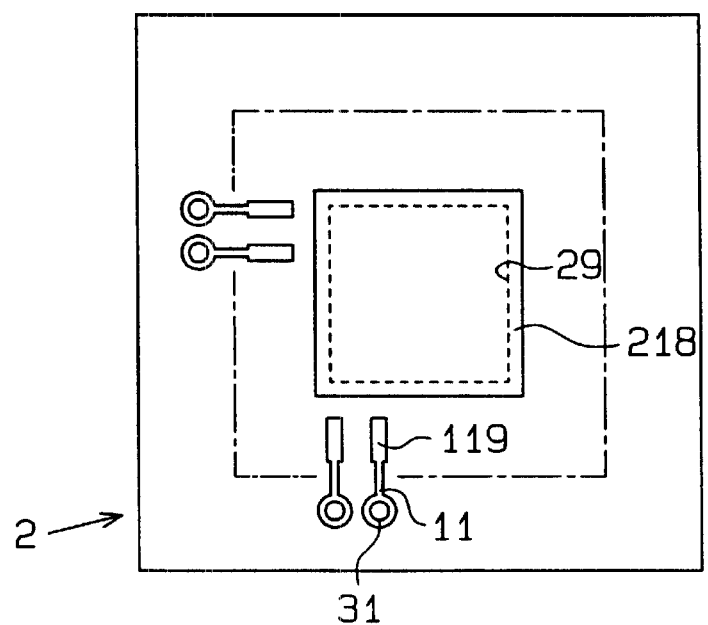
FIG. 47 is an enlarged view showing the periphery of an electronic component mounting hole of a laminated plate.

Then, as shown in FIGS. 46 and 47, patterning is performed on the copper foils 1 and the conductive coatings 67 to form the surface patterns 11, 14. The surface pattern 11 includes a connection pad 115 and a connection terminal 119. The covers 218, 219 covering the mounting hole 29 are formed on the upper and lower surfaces of the laminated plate 20 by performing patterning on the copper foils 1 and the conductive coatings 67.

(6) Removal of the Covers

Figure 48:
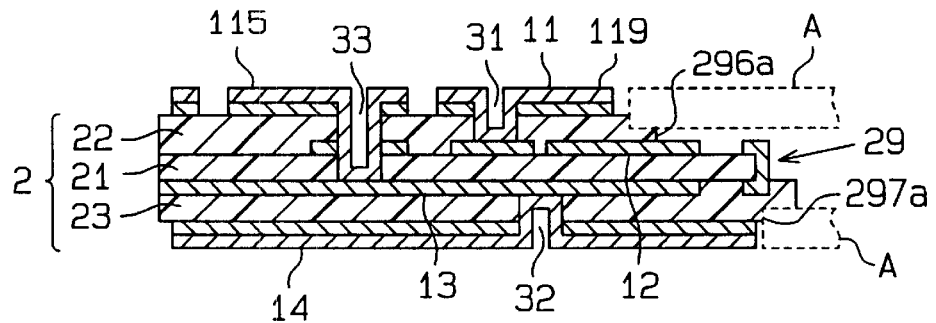
FIGS. 48 and 49 are cross-sectional views showing a method for manufacturing the multilayer electronic component mounting substrate according to the fifth embodiment of the present invention.
Figure 49A:
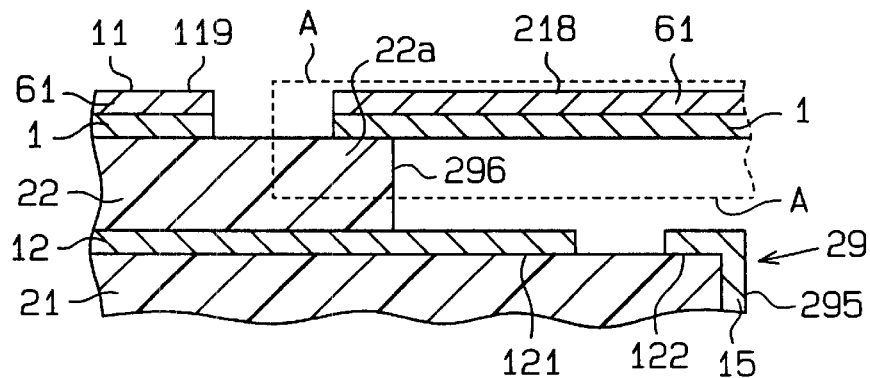
Figure 49B:
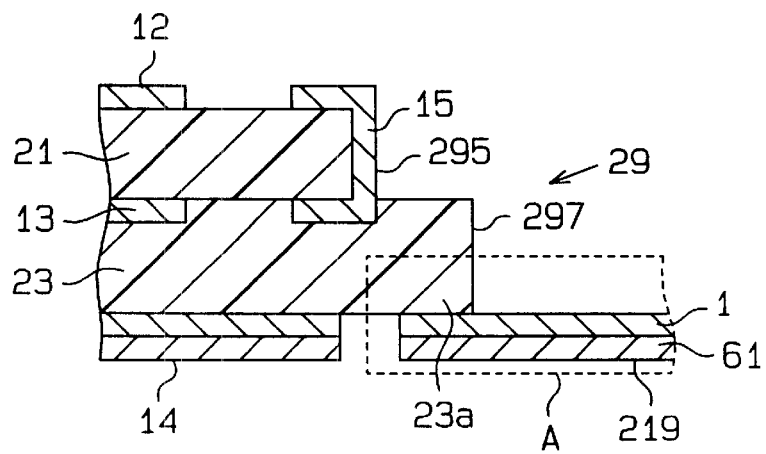

Afterward, as shown by the dotted frames A in FIGS. 48 and 49, spot facing is performed to remove portions of the insulating layers 22, 23 about the mounting hole 29 at the outer side of the covers 218, 219. This removes the covers 218, 219 together with portions 22a, 23a of the insulating layers 22, 23 surrounding the mounting hole 29 and exposes the mounting hole 29. At this time, the recess-like machining marks 296a, 297a, which are exposed to the interior of the mounting hole 29, are formed.

(7) Surface Post-treatment of the Laminated Plate

Figure 40:
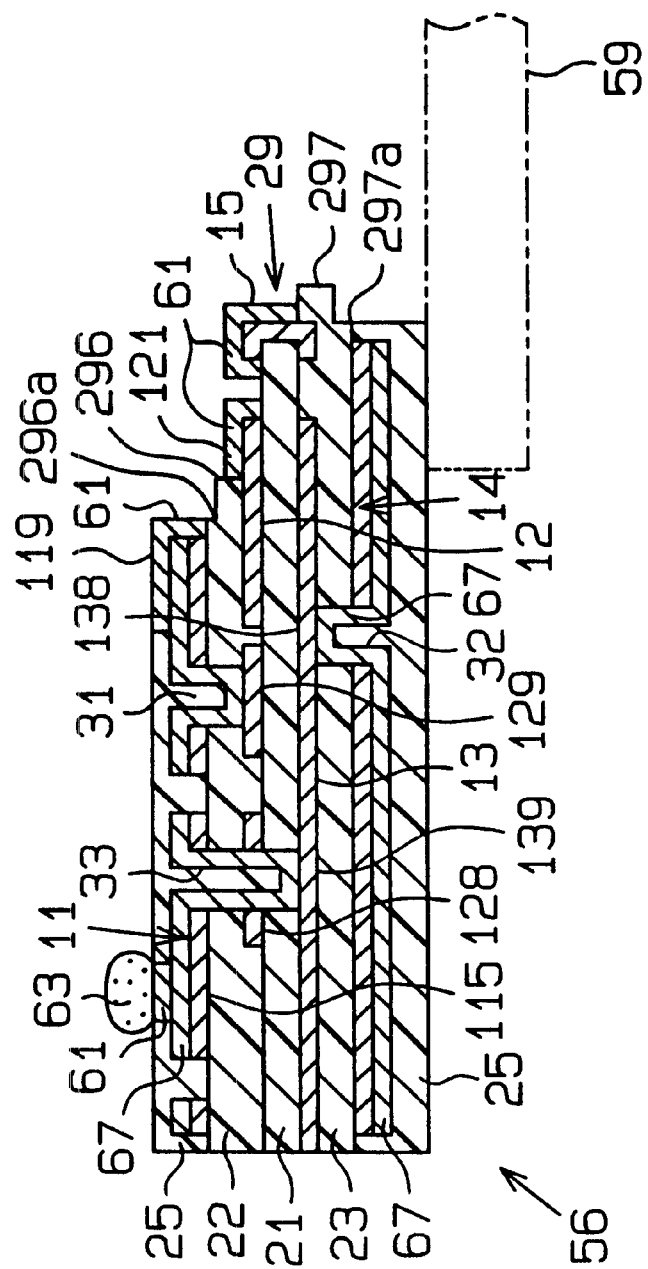
FIG. 40 is a schematic cross-sectional view showing a multilayer electronic component mounting substrate according to a fifth embodiment of the present invention.

Then, as shown in FIG. 40, after forming a solder resist 25 on the surface of the laminated plate 20, a connection metal coating 61 made of Ni/Au plating is formed, the solder ball 63 is connected, and the heat radiating plate 59 is secured thereby obtaining the multilayer electronic component mounting substrate 57.

The operation and effect of this embodiment will now be discussed.

As shown in FIGS. 45 to 47, the surface patterns 11, 14 are formed on the laminated substrate 20 with the mounting hole 29 covered by the copper foils 1. Thus, the etching liquid doe's not infiltrate the interior of the mounting hole 29 when the surface patterns 11, 14 are formed. Accordingly, the mounting hole 29, which includes complicated patterns, is prevented from being damaged.

The covers 218, 219 are removed together with portions 22a, 23a of the insulating layers 22, 23 surrounding the mounting hole 29. Thus, the covers 218, 219 are not left about the mounting hole 29. Further, burrs are not produced. This guarantees high connection reliability between the bonding pads 121, 122 and bonding wires.

As shown in FIGS. 49(a) and (b), the surface patterns 11, 14 are formed at the outer side of the openings 269, 297 of the insulating layers 22, 23. Accordingly, portions 22a, 23a of the insulating layers 22, 23 surrounding the mounting hole 29 and the covers 218, 219, which are located at the outer side of the wall surface 295 of the mounting hole 29 of the core substrate 21, are removed without damaging the surface patterns 11, 14. In this case, the insulating layers 22, 23 are supported by the core substrate 21. Thus, milling is performed while maintaining a certain level of mechanical strength.

In the fifth embodiment, the normal build-up process, in which the conductive holes are formed through the irradiation of ultraviolet rays without using a laser and performing development, may be employed.

What is claimed is:

1. A multilayer printed circuit board, characterized by:
    a core substrate including a core pattern;
    an insulating layer coating a surface of the core substrate;
    a surface pattern provided on a surface of the insulating layer; and
    a conductive hole for electrically connecting the surface pattern to the core pattern;
    wherein the core pattern includes a pad covering a bottom opening off the conductive hole;
    a mounting hole for mounting an electronic component;
    a connection terminal exposed together with the mounting hole; and
    a wall surface pattern formed on a wall of the mounting hole and electrically connected to the connection terminal.

2. The multilayer printed circuit board according to claim 1, characterized in that the core pattern includes a land surrounding a middle portion of the conductive hole.

3. The multilayer printed circuit board according to claim 1, characterized in that the insulating layer has a thickness of 30 to 150 $\mu$m.

4. The multilayer printed circuit board according to any one of claims 1 to 3, characterized in that the conductive hole has a diameter of 30 to 300 $\mu$m.

5. A method for manufacturing a multilayer electronic component mounting substrate, comprising:
    a first step of preparing a core substrate including an electronic component mounting hole, a connection terminal, a core pattern, and a pad;
    a second step of forming a laminated plate by laminating an insulating layer on a surface of the core substrate with the mounting hole and the connection terminal in an exposed state;

a third step of coating a surface of the connection terminal with an electroless plating film;

a fourth step of forming a metal layer on a surface of the laminated plate;

a fifth step of forming a conductive hole, the bottom opening of which is covered by the pad, by irradiating a laser beam at a conductive hole formation portion of the laminated plate;

a sixth step of forming a conductive coating on the interior of the conductive hole;

a seventh step of etching the metal layer and forming a surface pattern; and a step of heating the laminated plate performed after the third step, in which the surface of the connection terminal is coated with the electroless plating film, and before the seventh step, in which the surface pattern is formed, and a step of grinding a surface of the electroless plating film after heating the laminated plate and before forming the surface pattern.

6. A method for manufacturing a multilayer electronic component mounting substrate, comprising:

a first step of preparing a core substrate including an electronic component mounting hole, a connection terminal, a core pattern, and a pad;

a second step of forming a laminated plate by laminating an insulating layer on a surface of the core substrate with the mounting hole and the connection terminal in an exposed state;

a third step of forming a metal layer on a surface of the laminated plate;

a fourth step of coating a surface of the connection terminal with an electroless plating film;

a fifth step of etching the metal layer and forming a surface pattern;

a sixth step of forming a conductive hole, the bottom opening of which is covered by the pad, by irradiating a laser beam at a conductive hole formation portion of the laminated plate;

a seventh step of forming a conductive coating on the interior of the conductive hole; and a step of heating the laminated plate after the fourth step, in which the surface of the connection terminal is coated with the electroless plating film, and before the fifth step, in which the surface pattern is formed, and a step of grinding a surface of the electroless plating film after heating the laminated plate and before forming the surface pattern.

7. The method for manufacturing the multilayer electronic component mounting substrate according to claim 5 or 6, characterized in that the laminated plate is heated at 150° C. to 250° C.

8. The method for manufacturing the multilayer electronic component mounting substrate according to claim 5 or 6, characterized in that the electroless plating film is formed by an electroless Ni—Au plating or an electroless Ni—Pd plating.

9. The method for manufacturing the multilayer electronic component mounting substrate according to claim 5 or 6, characterized in that the connection terminal is formed from copper foil.

10. The method for manufacturing the multilayer electronic component mounting substrate according to claim 5 or 6, characterized by a step of forming an opening in the conductive hole formation portion of the metal layer before irradiating the laser beam at the conductive hole formation portion of the laminated plate.

11. A multilayer electronic component mounting substrate, comprising:

a mounting hole for mounting an electronic component;

a core substrate including a core pattern;

an insulating layer arranged on a surface of the core substrate;

a surface pattern arranged on the insulating layer;

a conductive hole for electrically connecting the core pattern to the surface pattern;

a connection terminal exposed together with the mounting hole; and a wall surface pattern formed on a wall of the mounting hole and electrically connected to the connection terminal;

wherein the connection terminal and the wall surface pattern are coated with an electroless plating film formed by an electroless Ni—Au plating or an electroless Ni—Pd plating; and the core pattern includes a pad covering a bottom opening of the conductive hole.

12. The multilayer electronic component mounting substrate according to claim 11, characterized in that the connection terminal and the wall surface pattern are formed from copper foil.

13. A method for manufacturing a multilayer electronic component mounting substrate, comprising the steps of:

preparing a core substrate including a core pattern and an electronic component mounting hole;

forming a laminated plate by laminating an insulating layer, which has an opening corresponding to the mounting hole, on a surface of the core substrate;

coating a surface of the laminated plate with metal foil to cover the mounting hole;

forming a conductive hole in the laminated plate and coating a wall of the conductive hole with a conductive coating;

patterning the metal foil to form a surface pattern, and forming a cover for covering the mounting hole and part of the insulating layer surrounding the mounting hole; and removing the cover by milling part of the insulating layer, which surrounds the mounting hole, to expose the mounting hole.

14. The method for manufacturing the multilayer electronic component mounting substrate according to claim 13, characterized in that the surface pattern is formed at the outer side of the opening of the insulating layer.

15. A multilayer electronic component mounting substrate, comprising:

a core substrate including a core pattern;

an insulating layer arranged on a surface of the core substrate;

a surface pattern provided on a surface of the insulating layer;

a conductive hole electrically connecting the surface pattern and the core pattern;

a mounting hole provided in the core substrate; and a wall surface pattern formed on a wall of the mounting hole and electrically connected to a connection terminal;

wherein the insulating layer includes an opening corresponding to the mounting hole and a recess surrounding the opening.

* * * * *